(12) United States Patent
Choi

(10) Patent No.: US 11,475,965 B2
(45) Date of Patent: Oct. 18, 2022

(54) MEMORY DEVICE AND OPERATING METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/205,375

(22) Filed: Mar. 18, 2021

(65) Prior Publication Data

US 2022/0093192 A1 Mar. 24, 2022

(30) Foreign Application Priority Data

Sep. 22, 2020 (KR) .................. 10-2020-0122030

(51) Int. Cl.
*G11C 16/10* (2006.01)
*G11C 16/34* (2006.01)
*G11C 7/10* (2006.01)
*G11C 16/26* (2006.01)
*G11C 16/30* (2006.01)
*G11C 16/24* (2006.01)

(52) U.S. Cl.
CPC ........ *G11C 16/3454* (2013.01); *G11C 7/1039* (2013.01); *G11C 7/1048* (2013.01); *G11C 16/102* (2013.01); *G11C 16/24* (2013.01); *G11C 16/26* (2013.01); *G11C 16/30* (2013.01); *G11C 16/3404* (2013.01)

(58) Field of Classification Search
CPC . G11C 16/3454; G11C 7/1039; G11C 7/1048; G11C 16/102; G11C 16/24; G11C 16/26; G11C 16/30; G11C 16/3404; G11C 16/10; G11C 16/0483; G11C 7/065; G11C 16/3459

See application file for complete search history.

(56) References Cited

U.S. PATENT DOCUMENTS

| 11,232,835 B2 * | 1/2022 | Hsu | G11C 16/24 |
| 2005/0232011 A1 * | 10/2005 | Lee | G11C 16/12 |
| | | | 365/185.12 |

FOREIGN PATENT DOCUMENTS

| KR | 10-1278103 | 6/2013 |
| KR | 10-1453969 | 10/2014 |
| KR | 10-2017-0005917 | 1/2017 |

* cited by examiner

*Primary Examiner* — Xiaochun L Chen
(74) *Attorney, Agent, or Firm* — IP & T Group LLP

(57) ABSTRACT

A memory device having improved performance includes: a plurality of memory cells programmed to one of a plurality of program states divided based on a threshold voltage; and a plurality of page buffers coupled to the plurality of memory cells through a plurality of bit lines. Each of the plurality of page buffers includes a latch for storing data sensed from a corresponding bit line among the plurality of bit lines, and discharges the corresponding bit line while performing a latch setting operation including setting data stored in the latch in a verify operation on the plurality of program states.

20 Claims, 20 Drawing Sheets

T1, T5, T6, T7 : Turn-off

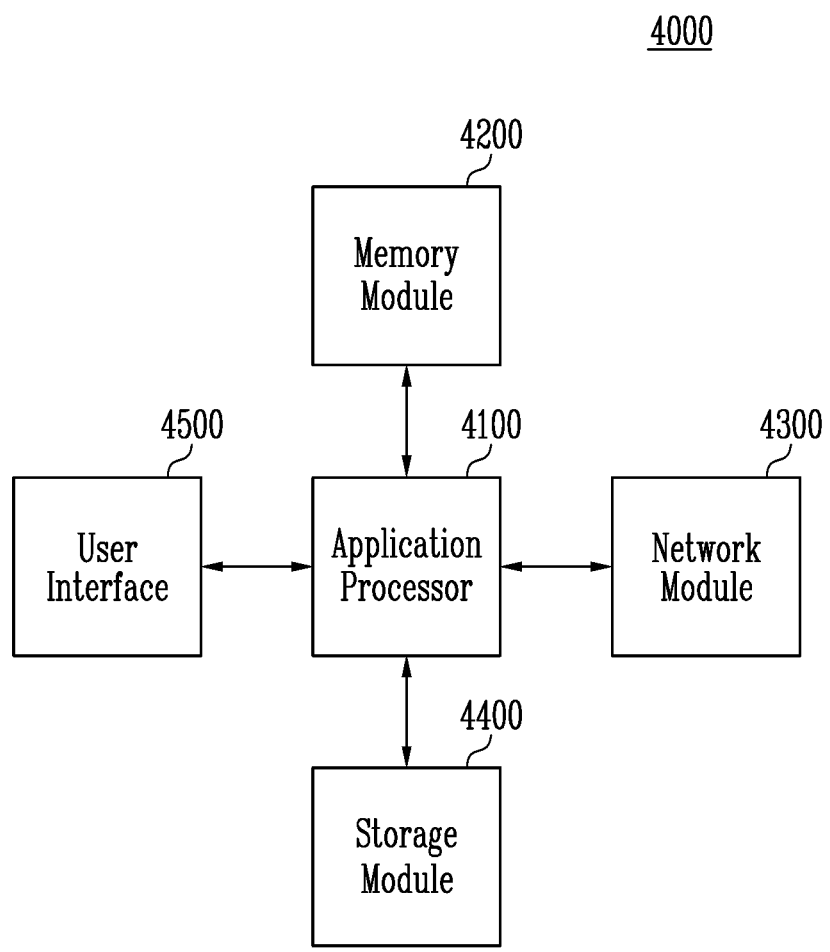

MEMORY DEVICE AND OPERATING METHOD THEREOF

CROSS-REFERENCE TO RELATED APPLICATION

The present application claims priority under 35 U.S.C. § 119(a) to Korean patent application number 10-2020-0122030, filed on Sep. 22, 2020, with the Korean Intellectual Property Office, and which is incorporated herein by reference in its entirety.

BACKGROUND

Field of Invention

One or more embodiments described herein relate to an electronic device, and more particularly, to a memory device and an operating method thereof.

Description of Related Art

A storage device stores data under control of a host device such as a computer or a smart phone. Such a storage device may include, for example, a memory device for storing data and a memory controller for controlling the memory device.

Generally, memory devices may be classified as volatile memory devices or nonvolatile memory devices. A volatile memory device stores data only when power is supplied. The stored data disappears when the supply of power is interrupted. Examples of volatile memory devices include a Static Random Access Memory (SRAM), a Dynamic Random Access Memory (DRAM), and the like.

A nonvolatile memory device stores data even when the supply of power is interrupted. Examples of nonvolatile memory devices include a Read Only Memory (ROM), a Programmable ROM (PROM), an Electrically Programmable ROM (EPROM), an Electrically Erasable ROM (EEROM), a flash memory, and the like.

SUMMARY

Embodiments provide a memory device having improved performance and an operating method of the memory device.

In accordance with an aspect of the present disclosure, a memory device including: a plurality of memory cells programmed to one of a plurality of program states divided based on a threshold voltage; and a plurality of page buffers coupled to the plurality of memory cells through a plurality of bit lines, wherein each of the plurality of page buffers includes a latch configured to store data sensed from a corresponding bit line among the plurality of bit lines, and discharges the corresponding bit lines while performing a latch setting operation including setting data stored in the latch in a verify operation on the plurality of program states.

In accordance with another aspect of the present disclosure, a page buffer coupled to a plurality of memory cells through a bit line, the page buffer including: a latch configured to store data sensed from the bit line; a latch setting circuit configured to perform a latch setting operation which includes setting data stored in the latch in a verify operation on the plurality of memory cells; and a bit line controller configured to discharge the bit line while the latch setting operation is being performed.

In accordance with another aspect of the present disclosure, a method for operating a memory device include a plurality of memory cells programmed to one of a plurality of program states divided based on a threshold voltage. The method including: performing a latch setting operation which includes setting data stored in a latch; discharging a bit line connected to the plurality of memory cells while performing the latch setting operation; and precharging the bit line according to whether the latch setting operation has been completed.

In accordance with another aspect of the present disclosure, an apparatus including: a page buffer coupled to memory cells through a bit line, and including a latch configured to store data sensed from the bit line; and a controller coupled to the page buffer. The controller is configured to generate: a first signal for controlling the latch; a second signal for controlling a latch setting operation which includes setting data stored in the latch in a verify operation on memory cells; and a third signal for discharging the bit line while the latch setting operation is being performed.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 19 illustrates an embodiment of a user system to which a storage device may be applied.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
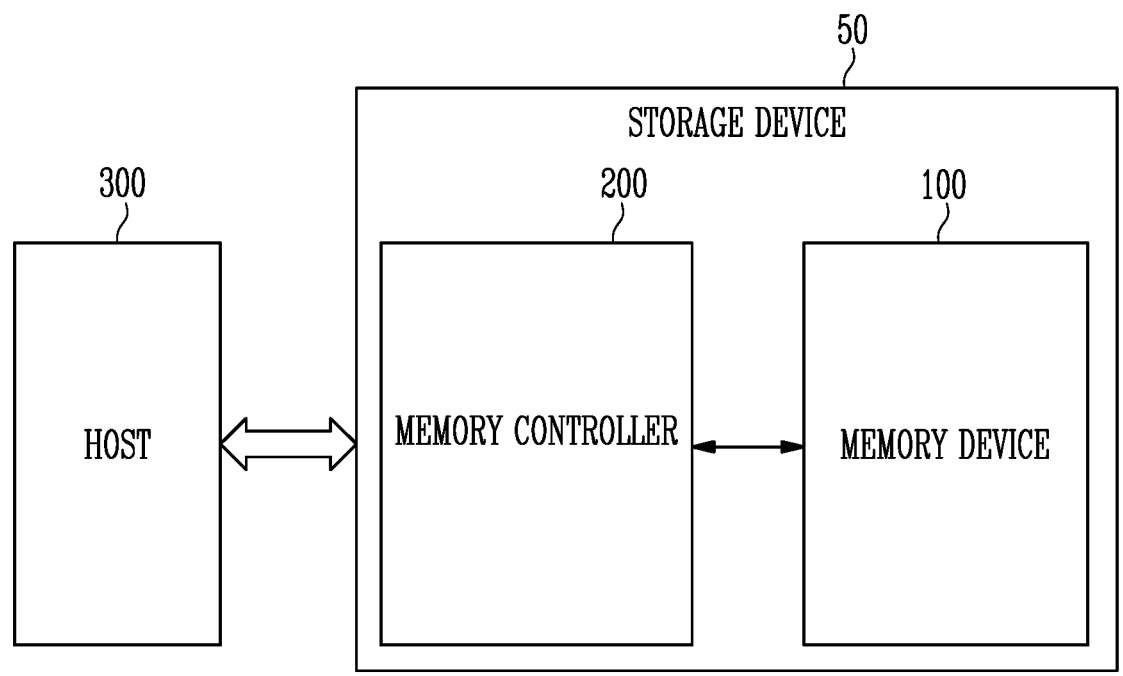
FIG. 1 illustrates an embodiment of a storage device.

FIG. 1 is a diagram illustrating an embodiment of a storage device 50, which may include a memory device 100 and a memory controller 200 for controlling operation of the memory device 100. The storage device 50 may store data under the control of a host 300. Examples of the host 300 include a mobile phone, a smart phone, an MP3 player, a laptop computer, a desktop computer, a game console, a TV, a tablet PC, and an in-vehicle infotainment system.

The storage device 50 may be manufactured as any one of various types of storage devices according to the communication standard or protocol of a host interface of the host 300. Examples of storage device 50 include a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. Examples include Package-On-Package (POP), System-In-Package (SIP), System-On-Chip (SOC), Multi-Chip Package (MCP), Chip-On-Board (COB), Wafer-level Fabricated Package (WFP), and Wafer-level Stack Package (WSP).

The memory device 100 stores data under the control of the memory controller 200. The memory device 100 may include at least one memory cell array, each including a plurality of memory cells for storing data. Each of the memory cells may operate, for example, as a Single Level Cell (SLC) storing one data bit, a Multi-Level Cell (MLC) storing two data bits, a Triple Level Cell (TLC) storing three data bits, or a Quadruple Level Cell (QLC) storing four data bits.

Each memory cell array may include a plurality of memory blocks, with each memory block including one or more memory cells. In one embodiment, one or more of the memory blocks may include a plurality of pages. Each page may serve as a unit for storing data in the memory device 100 or for reading data stored in the memory device 100. The memory block may be a unit for erasing data.

Examples of the memory device 100 include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. For convenience of description, a case where the memory device 100 is a NAND flash memory will be described.

The memory device 100 may receive a command CMD and an address ADDR from the memory controller 200, and then may access a zone selected by the address ADDR in the memory cell array. The memory device 100 may then perform an operation indicated by the command CMD on the zone selected by the address ADDR. For example, the memory device 100 may perform a write operation (e.g., a program operation), a read operation, and an erase operation. In the program operation, the memory device 100 may program data in the zone selected by the address ADDR. In the read operation, the memory device 100 may read data from the zone selected by the address ADDR. In the erase operation, the memory device 100 may erase data stored in the zone selected by the address ADDR.

The memory controller 200 may control overall operations of the storage device 50. When power is applied to the storage device 50, the memory controller 200 may execute firmware (FW). When the memory device 100 is a flash memory device, the FW may include a host interface layer (HIL) for controlling communication with the host 300, a flash translation layer (FTL) for controlling communication between the host and the memory device 100, and a flash interface layer (FIL) for controlling communication with the memory device 100.

In an embodiment, the memory controller 200 may receive data and a Logical Block Address (LBA) from the host 300 and then translate the LBA into a Physical Block Address (PBA) representing addresses of memory cells in the memory device 100, in which data is to be stored. In one or more embodiments, the terms LBA and a "logic address" or "logical address" may be used synonymously. Also, the terms PBA and a "physical address" may be used synonymously.

The memory controller 200 may control the memory device 100 to perform a program operation, a read operation, an erase operation, or another operation in response to a request from the host 300. In the program operation, the memory controller 200 may provide a program command, a PBA, and/or data to the memory device 100. In the read operation, the memory controller 200 may provide a read command and/or a PBA to the memory device 100. In the erase operation, the memory controller 200 may provide an erase command and/or a PBA to the memory device 100.

In an embodiment, the memory controller 200 may autonomously generate a command, an address, and data regardless of any request from the host 300, and may transmit the command, the address, and the data to the memory device 100. For example, the memory controller 200 may provide the memory device 100 with a command, an address, and data, which are used to perform read and program operations accompanied in performing wear leveling, read reclaim, garbage collection, or other operations.

In an embodiment, the memory controller 200 may control at least two memory devices 100. The memory controller 200 may control the memory devices, for example, according to an interleaving technique so as to improve operational performance. The interleaving technique may be, for example, a technique for controlling operations on at least two memory devices 100 to overlap with each other.

The host 300 may communicate with the storage device 50 using at least one of a plurality of forms of communication. Examples include a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
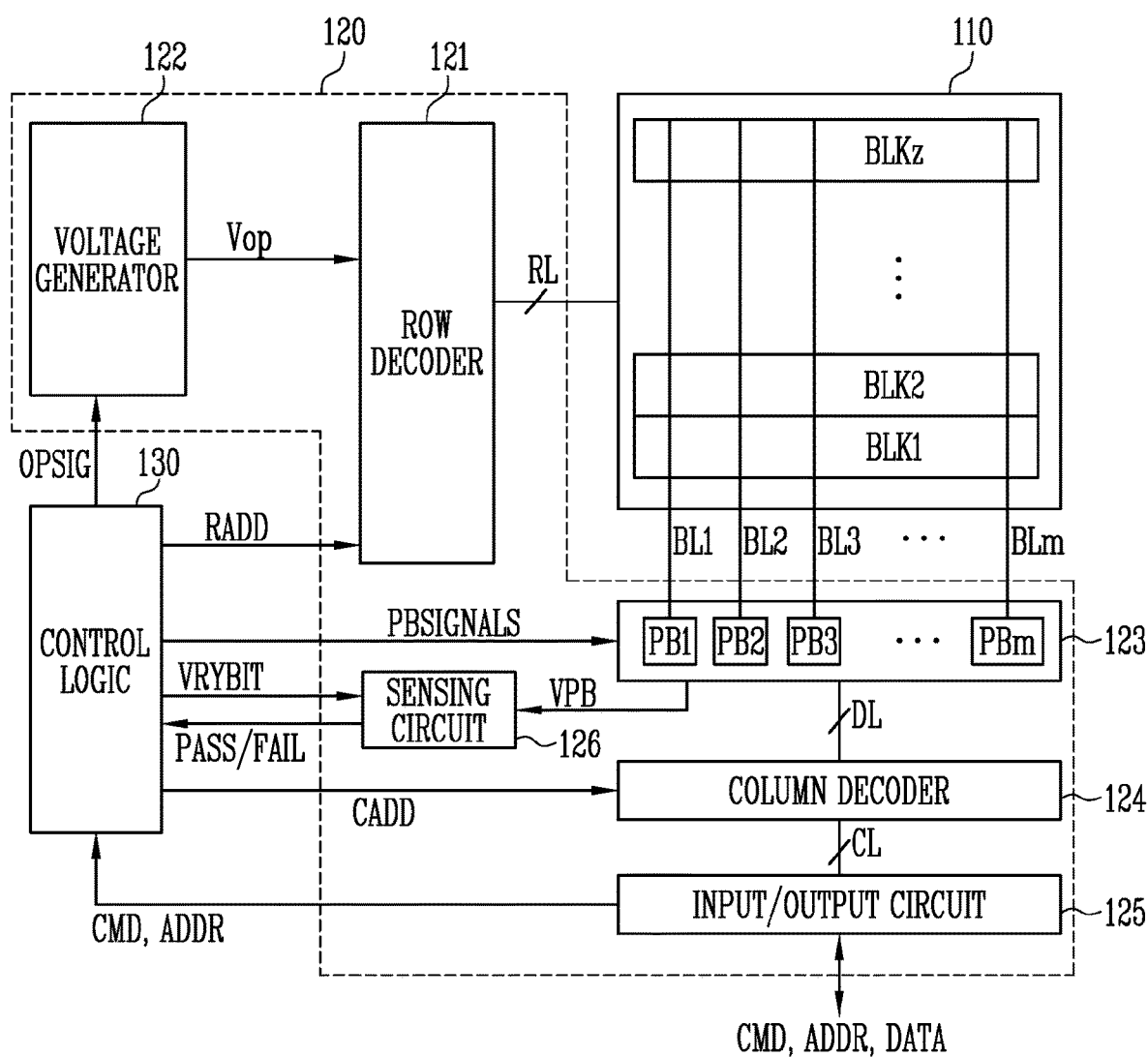
FIG. 2 illustrates an embodiment of a memory device.

FIG. 2 is a diagram illustrating an embodiment of the memory device 100 shown in FIG. 1. Referring to FIG. 2, the memory device 100 may include at least one memory cell array 110, a peripheral circuit 120, and control logic 130.

The memory cell array 110 includes a plurality of memory blocks BLK1 to BLKz connected to a row decoder 121 through corresponding row lines RL. The plurality of memory blocks BLK1 to BLKz are connected to a page buffer group 123 through bit lines BL1 to BLm. Each of the plurality of memory blocks BLK1 to BLKz includes a plurality of memory cells, which, for example, may be nonvolatile memory cells. Memory cells connected to the same word line may be defined as one page. Therefore, one memory block may include a plurality of pages.

The row lines RL may include at least one source select line, a plurality of word lines, and at least one drain select line. Each of the memory cells in the memory cell array 110 may be configured, for example, as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLm or may discharge applied voltages under the control of the control logic 130.

The peripheral circuit 120 may include the row decoder 121, the voltage generator 122, the page buffer group 123, a column decoder 124, an input/output circuit 125, and a sensing circuit 126. The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 operates under the control of the control logic. The row decoder 121 receives a row address RADD from the control logic 130 and decodes the row address RADD. The row decoder 121 selects at least one memory block among the memory blocks BLK1 to BLKz according to the decoded address. Also, the row decoder 121 may select at least one word line of the selected memory block in order to apply voltages, generated by the voltage generator 122, to the at least one word line WL according the decoded address.

For example, in a program operation, the row decoder 121 may apply a program voltage to the selected word line and may apply a program pass voltage (e.g., having a level lower than that of the program voltage) to unselected word lines. In a program verify operation, the row decoder 121 may apply a verify voltage to the selected word line and may apply a verify pass voltage (e.g., having a level higher than that of the verify voltage) to the unselected word lines.

In a read operation, the row decoder 121 may apply a read voltage to the selected word line and may apply a read pass voltage (e.g., having a level higher than that of the read voltage) to the unselected word lines.

In an embodiment, an erase operation of the memory device 100 is performed in a memory block unit. In the erase operation, the row decoder 121 may select one memory block according to the decoded address. In the erase operation, the row decoder 121 may apply a reference (e.g., ground) voltage to word lines connected to the selected memory blocks.

The voltage generator 122 operates under the control of the control logic 130. The voltage generator 122 generates a plurality of voltages based on an external power voltage supplied to the memory device 100. For example, the voltage generator may generate various operating voltages Vop used in program, read, and erase operations in response to an operation signal OPSIG. In one embodiment, the voltage generator 122 may generate a program voltage, a verify voltage, a pass voltage, a read voltage, an erase voltage, and/or another voltage under control of the control logic 130.

In an embodiment, the voltage generator 122 may generate an internal power voltage by regulating the external power voltage. The internal power voltage may be used as an operation voltage of the memory device 100.

In an embodiment, the voltage generator 122 may generate a plurality of voltages using the external power voltage or the internal power voltage. For example, the voltage generator 122 may include a plurality of pumping capacitors for receiving the internal power voltage, and may generate the plurality of voltages by selectively activating the plurality of pumping capacitors under the control of the control logic 130. The plurality of generated voltages may be supplied to the memory cell array 110 by the row decoder 121.

The page buffer group 123 includes first to mth page buffers PB1 to PBm. The first to mth page buffers PB1 to PBm are connected to the memory cell array 110, respectively, through first to mth bit lines BL1 to BLm. The first to mth bit lines BL1 to BLm operate under the control of the control logic 130. For example, the first to mth bit lines BL1 to BLm may operate in response to page buffer control signals PBSIGNALS. In one embodiment, the first to mth page buffers PB1 to PBm may temporarily store data received through the first to mth bit lines BL1 to BLm, or may sense a voltage or current of the bit lines BL1 to BLm in a read or verify operation.

In a program operation, the first to mth page buffers PB1 to PBm may, for example, transfer data DATA received through the input/output circuit 125 to selected memory cells through the first to mth bit lines BL1 to BLm. This may occur when a program voltage is applied to a selected word line. Memory cells of a selected page are programmed according to the transferred data DATA. A memory cell connected to a bit line, to which a program allow voltage (e.g., a ground voltage) is applied, may have an increased threshold voltage. A threshold voltage of a memory cell connected to a bit line, to which a program inhibit voltage (e.g., a power voltage) is applied, may be maintained. In a program verify operation, the first to mth page buffers PB1 to PBm may read page data from the selected memory cells through the first to mth bit lines BL1 to BLm.

In a read operation, the first to mth page buffers PB1 to PBm read data DATA from the memory cells of the selected page through the first to mth bit lines BL1 to BLm, and output the read data DATA to the input/output circuit 125 under the control of the column decoder 124.

In an erase operation, the first to mth page buffers PB1 to PBm may float the first to mth bit lines BL1 to BLm.

The column decoder 124 may communicate data between the input/output circuit 125 and the page buffer group 123 in response to a column address CADD. For example, the column decoder 124 may communicate data with the first to mth page buffers PB1 to PBm through data lines DL or may communicate data with the input/output circuit 125 through column lines CL.

The input/output circuit 125 may transfer a command CMD and an address ADDR, which are received from the memory controller 200 described with reference to FIG. 1, to the control logic 130 or may exchange data DATA with the column decoder 124.

In a read operation or verify operation, the sensing circuit 126 may generate a reference current in response to an allow bit VRYBIT signal, and may output a pass signal PASS or fail signal FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. Also, the control logic 130 may determine whether the verify operation has passed or failed in response to the pass signal PASS or fail signal FAIL.

Figure 3:
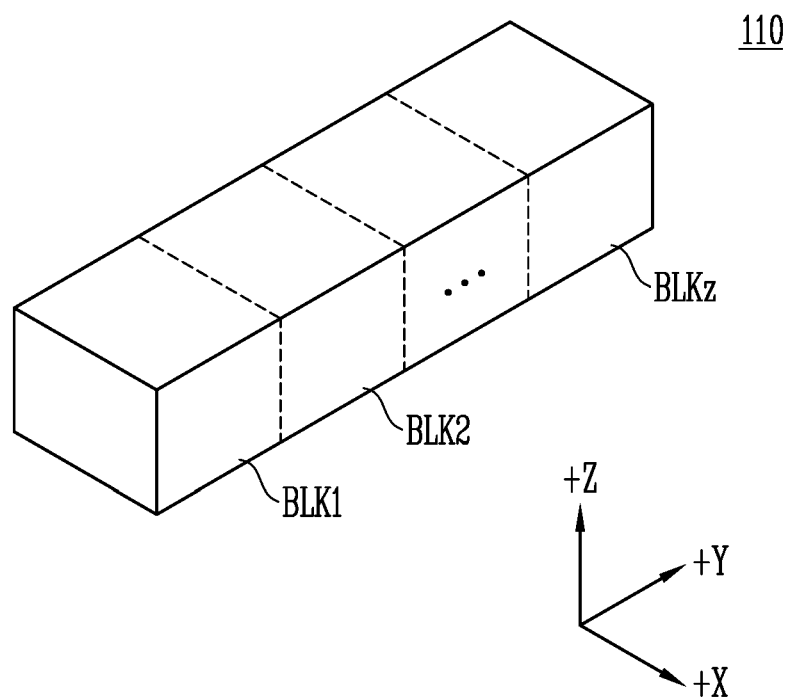
FIG. 3 illustrates an embodiment of a memory cell array.

FIG. 3 is a diagram illustrating an embodiment of the memory cell array 110 shown in FIG. 2. Referring to FIG. 3, the memory cell array 110 may include a plurality of memory blocks BLK1 to BLKz, where each memory block may have a three-dimensional structure. Each memory block may include a plurality of memory cells stacked on a substrate. The plurality of memory cells may be arranged along predetermined directions, e.g., +X, +Y, and +Z directions. An example of a structure of each memory block will be described with reference to FIGS. 4 and 5.

Figure 4:
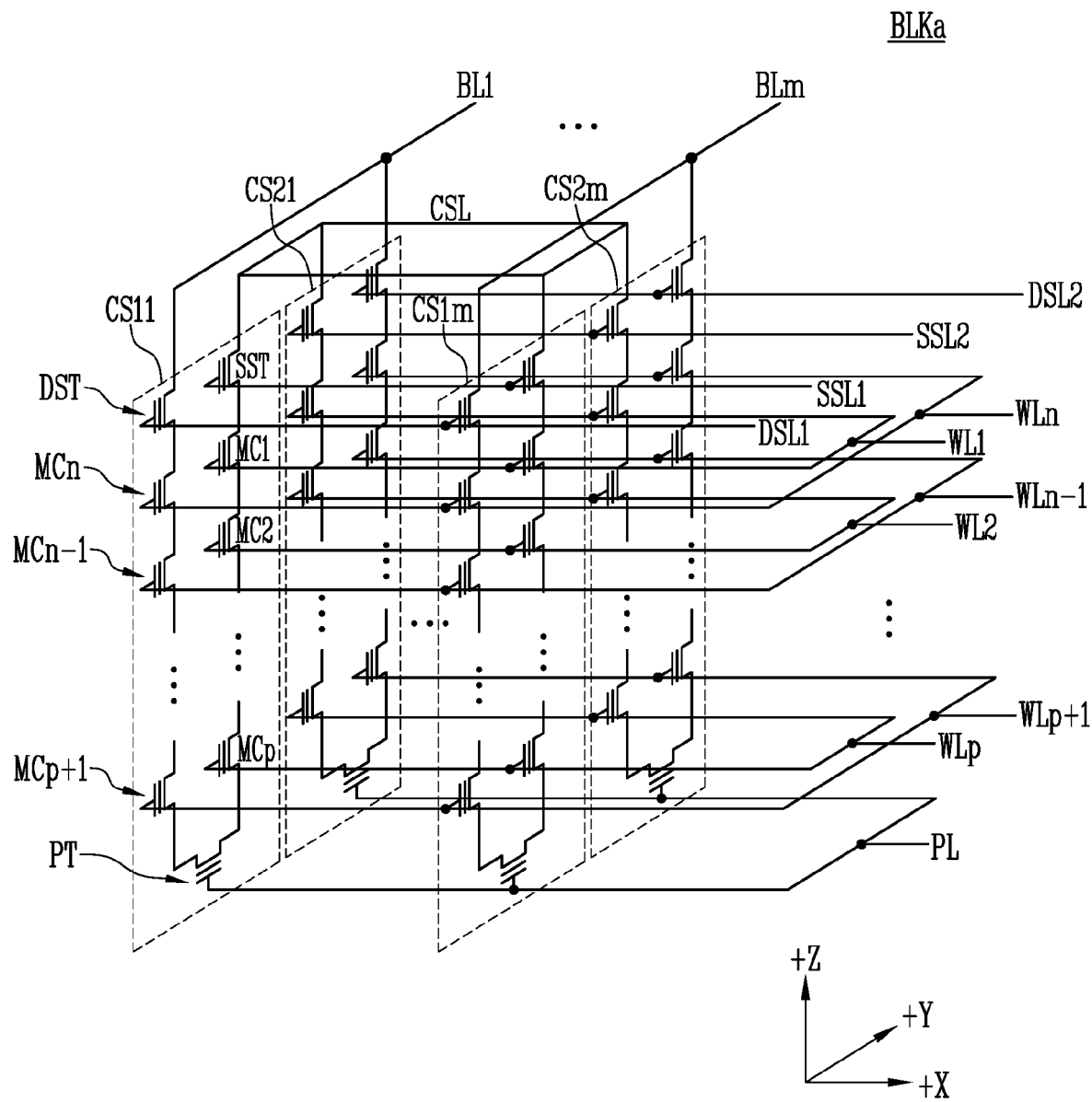
FIG. 4 illustrates an embodiment of a memory block.

FIG. 4 is a circuit diagram illustrating an embodiment of a memory block BLKa, which may represent one or more of the memory blocks BLK1 to BLKz shown in FIG. 3. Referring to FIG. 4, the memory block BLKa may include a plurality of memory cell strings CS11 to CS1m and CS21 to CS2m.

In an embodiment, each of the plurality of memory cell strings CS11 to CS1m and CS21 to CS2m may be formed in a predetermined shape, e.g., a 'U' shape. In the memory block BLKa, m memory cell strings are arranged in a row direction (i.e., a +X direction). FIG. 4 illustrates two memory cell strings arranged in a column direction (i.e., a +Y direction). However, this is for convenience of description, and it will be understood that three memory cell strings may be arranged in the column direction.

Each of the plurality of memory cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and each of the memory cells MC1 to MCn may include a channel layer, a tunneling insulating layer, a charge storage layer, and a blocking insulating layer. In an embodiment, a pillar for providing the channel layer may be in each memory cell string. In an embodiment, a pillar for providing at least one of the channel layer, the tunneling insulating layer, the charge storage layer, or the blocking insulating layer may be provided in each memory cell string.

The source select transistor SST of each memory cell string is connected between a common source line CSL and memory cells MC1 to MCp. In an embodiment, the source select transistors of memory cell strings arranged on the same row are connected to a source select line extending in the row direction. The source select transistors of memory cell strings arranged on different rows are connected to different source select lines. In FIG. 4, the source select transistors of the memory cell strings CS11 to CS1m on a first row are connected to a first source select line SSL1. The source select transistors of the memory cell strings CS21 to CS2m on a second row are connected to a second source select line SSL2. In one embodiment, the source select transistors of the memory cell strings CS11 to CS1m and CS21 to CS2m may be commonly connected to one source select line.

The first to nth memory cells MC1 to MCn of each memory cell string are connected between the source select transistor SST and the drain select transistor DST. The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each memory cell string are connected to first to nth word lines WL1 to WLn, respectively.

A gate of the pipe transistor PT of each memory cell string is connected to a pipe line PL.

The drain select transistor DST of each memory cell string is connected between a corresponding bit line and the memory cells MCp+1 to MCn. Memory cell strings arranged in the row direction are connected to a drain select line extending in the row direction. The drain select transistors of the memory cell strings CS11 to CS1m on the first row are connected to a first drain select line DSL1. The drain select transistors of the memory cell strings CS21 to CS2m on the second row are connected to a second drain select line DSL2.

Memory cell strings arranged in the column direction are connected to a bit line extending in the column direction. In FIG. 4, the memory cell strings CS11 and CS21 on a first column are connected to a first bit line BL1. The memory cell strings CS1m and CS2m on an mth column are connected to an mth bit line BLm.

Memory cells connected to the same word line in the memory cell strings arranged in the row direction constitute one page. For example, memory cells connected to the first word line WL1 in the memory cell strings CS11 to CS1m on the first row constitute one page. Memory cells connected to the first word line WL1 in the memory cell strings CS21 to CS2m on the second row constitute another page. As any one of the drain select lines DSL1 and DSL2 is selected, memory cell strings arranged in one row direction may be selected. As any one of the word lines WL1 to WLn is selected, one page may be selected in the selected memory cell strings.

In one embodiment, even bit lines and odd bit lines may be provided instead of the first to mth bit lines BL1 to BLm. In addition, even-numbered memory cell strings, among the memory cell strings CS11 to CS1m or CS21 to CS2m arranged in the row direction, may be connected to the even bit lines, respectively. Also, odd-numbered memory cell strings, among the memory cell strings CS11 to CS1m or CS21 to CS2m arranged in the row direction, may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. In one embodiment, the at least one dummy memory cell may be provided to decrease an electric field between the drain select transistor DST and the memory cells MCp+1 to MCn. When the number of dummy memory cells increases, reliability of an operation of the memory block BLKa may be improved but the size of the memory block BLKa may increase. When the number of dummy memory cells decreases, the size of the memory block BLKa decreases but the reliability of an operation of the memory block BLKa may be deteriorated.

In order to efficiently control the at least one dummy memory cell, the dummy memory cells may have a predetermined threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the predetermined threshold voltage.

Figure 5:
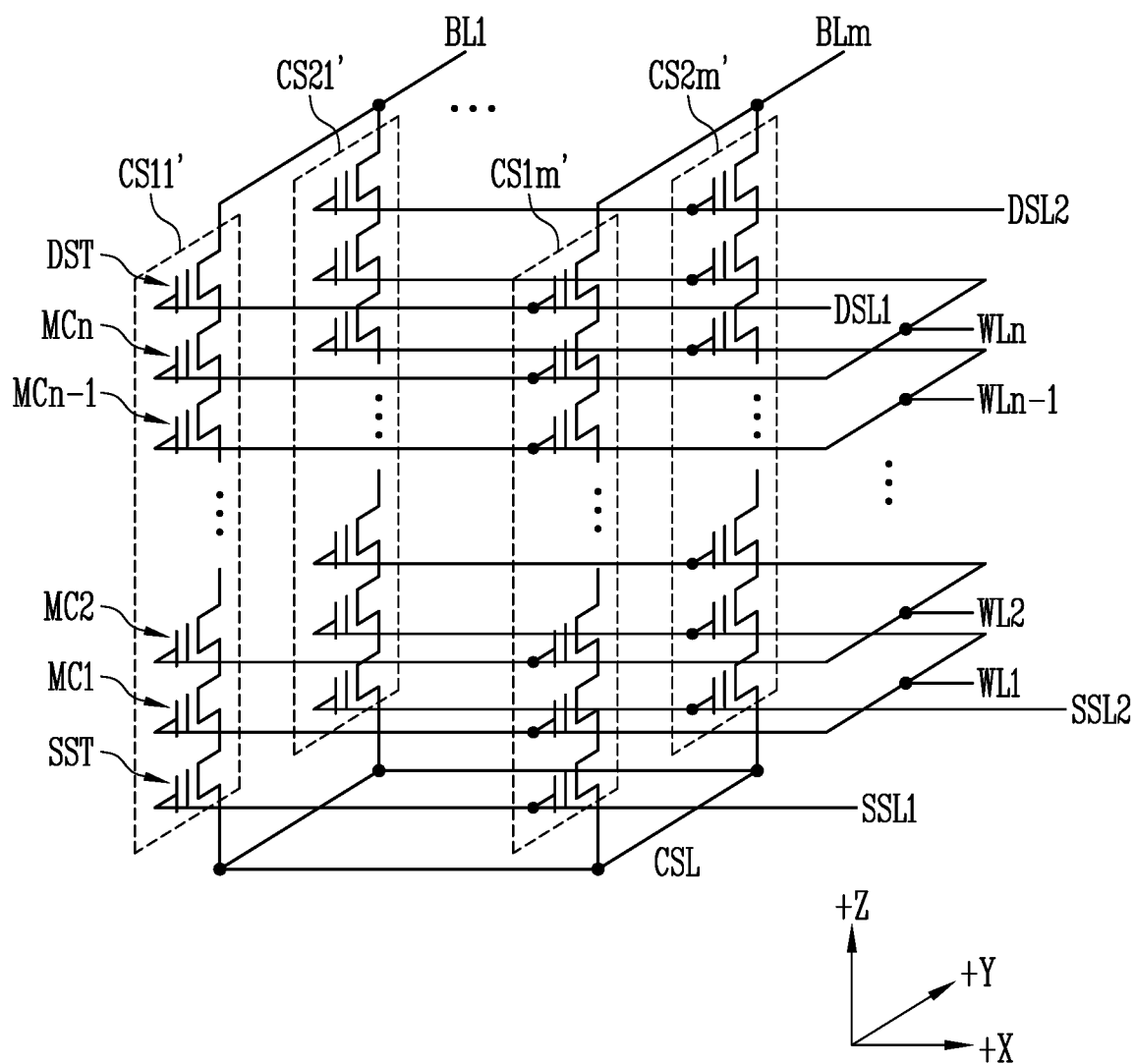
FIG. 5 illustrates another embodiment of a memory block.

FIG. 5 is a circuit diagram illustrating an embodiment of a memory block BLKb, which may be representative of the memory blocks BLK1 to BLKz shown in FIG. 3. Referring to FIG. 5, the memory block BLKb may include a plurality of memory cell strings CS11' to CS1m' and CS21' to CS2m, each of which may extend along the +Z direction. Each of the plurality of memory cell strings CS11' to CS1m' and CS21' to CS2m' includes at least one source select transistor SST, first to nth memory cells MC1 to MCn, and at least one drain select transistor DST, which are stacked on a substrate under the memory block BLKb.

The source select transistor SST of each memory cell string is connected between a common source line CSL and the memory cells MC1 to MCn. The source select transistors of memory cell strings arranged on the same row are connected to the same source select line. The source select transistors of the memory cell strings CS11' to CS1m' arranged on a first row are connected to a first source select line SSL1. Source select transistors of the memory cell strings CS21' to CS2m' arranged on a second row are connected to a second source select line SSL2. In one embodiment, the source select transistors of the memory cell strings CS11' to CS1m' and CS21' to CS2m' may be commonly connected to one source select line.

The first to nth memory cells MC1 to MCn of each memory cell string are connected in series between the source select transistor SST and the drain select transistor DST. Gate electrodes of the first to nth memory cells MC1 to MCn are connected to first to nth word lines WL1 to WLn, respectively.

The drain select transistor DST of each memory cell string is connected between a corresponding bit line and the memory cells MC1 to MCn. The drain select transistors of memory cell strings arranged in the row direction are connected to a drain select line extending in the row direction. The drain select transistors of the memory cell strings CS11' to CS1m' on the first row are connected to a first drain select line DSL1. The drain select transistors of the memory cell strings CS21' to CS2m' on the second row are connected to a second drain select line DSL2.

As a result, the memory block BLKb of FIG. 5 may have a circuit similar to that of the memory block BLKa of FIG. 4, except that the pipe transistor PT is excluded from each memory cell string in FIG. 5.

In one embodiment, even bit lines and odd bit lines may be provided instead of the first to mth bit lines BL1 to BLm. In addition, even-numbered memory cell strings, among the memory cell strings CS11' to CS1m' or CS21' to CS2m' arranged in the row direction, may be connected to the even bit lines, respectively. Also, odd-numbered memory cell strings, among the memory cell strings CS11' to CS1m' or CS21' to CS2m' arranged in the row direction, may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1to MCn. In one embodiment, the at least one dummy memory cell may be provided to decrease an electric field between the drain select transistor DST and the memory cells MC1 to MCn. When the number of dummy memory cells increases, reliability of an operation of the memory block BLKb may be improved but the size of the memory block BLKb may be increased. When the number of dummy memory cells decreases, the size of the memory block BLKb decreases but reliability of an operation of the memory block BLKb may be deteriorated.

In order to efficiently control the at least one dummy memory cell, the dummy memory cells may have a predetermined threshold voltage. Before or after an erase operation of the memory block BLKb, a program operation may be performed on all or some of the dummy memory cells.

When an erase operation is performed after the program operation is performed, the threshold voltage of the dummy memory cells control a voltage applied to the dummy word lines connected to the respective dummy memory cells, so that the dummy memory cells can have the predetermined threshold voltage.

Figure 6:
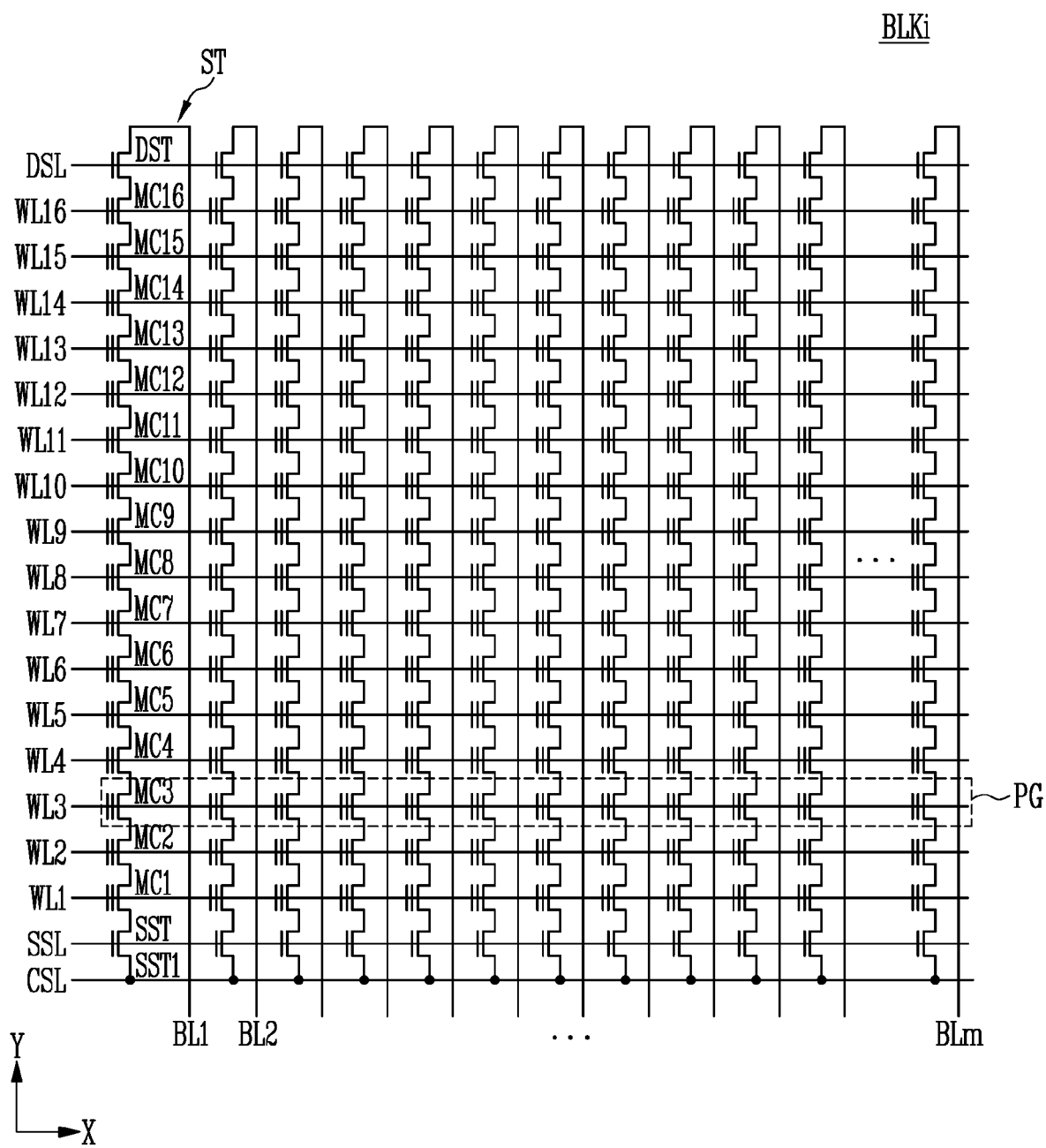
FIG. 6 illustrates another embodiment of a memory block.

FIG. 6 is a circuit diagram illustrating an embodiment of a memory block BLKi, which may be representative of the memory blocks BLK1 to BLKz shown in FIG. 3. Referring to FIG. 6, in the memory block BLKi, a plurality of word lines arranged in parallel to each other may be connected between a first select line and a second select line. The first select line may be a source select line SSL, and the second select line may be a drain select line DSL. For example, the memory block BLKi may include a plurality of memory cell strings ST connected between bit lines BL1 to BLm and a common source line CSL. The bit lines BL1 to BLm may be respectively connected to the memory cell strings ST, and the common source line CSL may be commonly connected to the memory cell strings ST. The memory cell strings ST may be configured identically to one another. For illustrative purposes, a memory cell string ST connected to a first bit line BL1 will be described as an example.

The memory cell string ST may include a source select transistor SST, a plurality of memory cells MC1 to MC16, and a drain select transistor DST, which are connected in series to each other between the common source line CSL and the first bit line BL1. At least one drain select transistor DST may be included in one memory cell string ST, and source select transistors (e.g., of a number greater than the number of the source select transistor(s) SST shown in the drawing, and memory cells of a number greater than the number of memory cells MC1 to MC16 shown in the drawing) may be included in the one memory cell string ST.

The source of the source select transistor SST may be connected to the common source line SL, and the drain of the drain select transistor DST may be connected to the first bit line BL1. The memory cells MC1 to MC16 may be connected in series between the source select transistor SST and the drain select transistor DST. Gates of the source select transistors SST in different memory cell strings ST may be connected to the source select line SSL. Gates of drain select transistors DST in different memory cell strings ST may be connected to the drain select line DSL. Gates of the memory cells MC1 to MC16 may be connected to a plurality of word lines WL1 to WL16.

A group of memory cells connected to the same word line, among memory cells in different memory cell strings ST, may be referred to as a physical page PG. Therefore, physical pages PG corresponding to the number of the word lines WL1 to WL16 may be in the memory block BLKi.

In one embodiment, one memory cell may store one-bit data. In this case, the one memory cell may be referred to as a single level cell (SLC). One physical page PG may store one logical page (LPG) data. One LPG data may include data bits corresponding to the number of cells in the one physical page PG. In one embodiment, one memory cell may store two or more-bit data. In this case, one physical page PG may store two or more LPG data.

Figure 7:
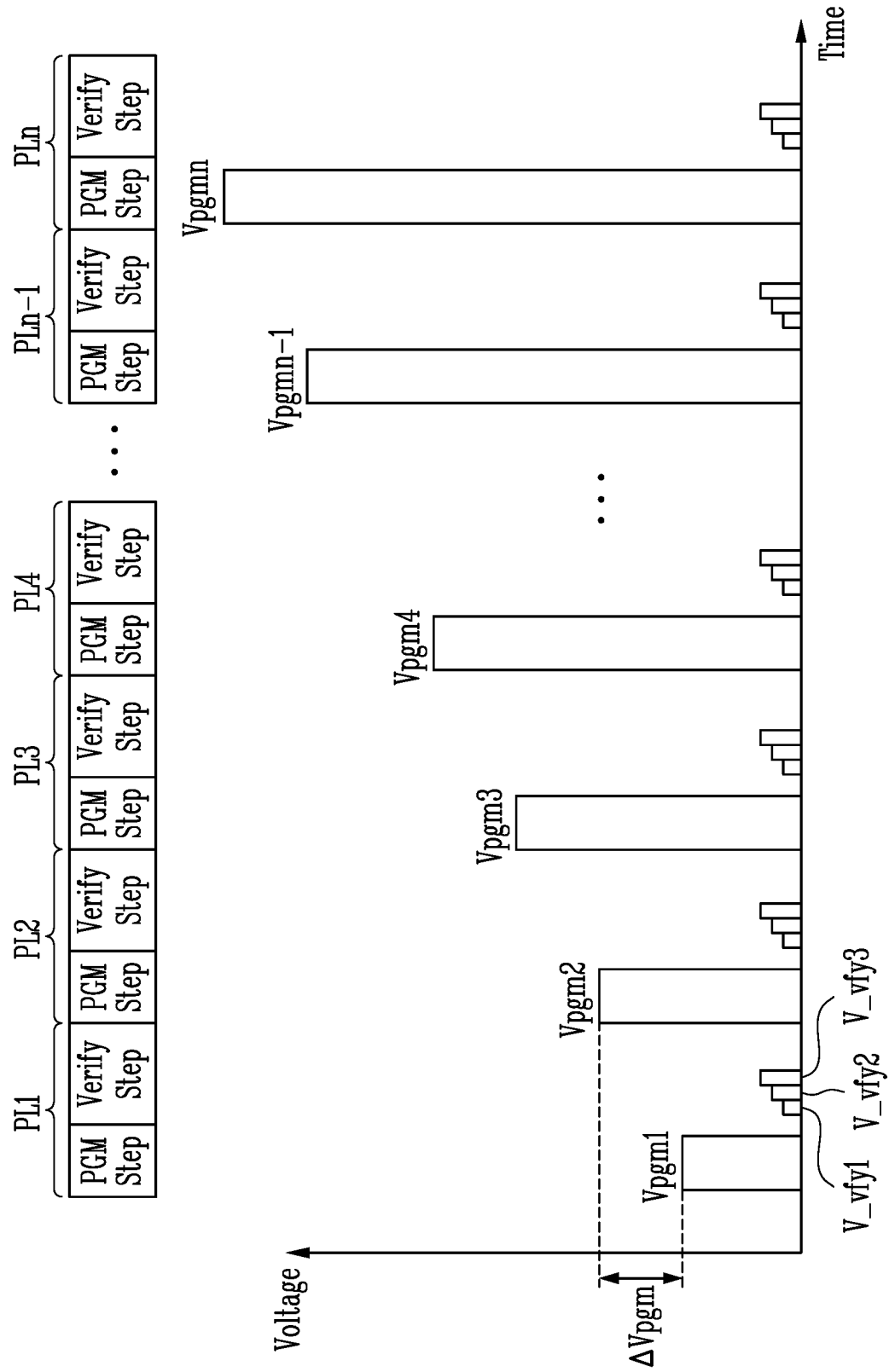
FIG. 7 illustrates an embodiment of a program operation of a memory device.

FIG. 7 is a diagram illustrating an embodiment of a program operation of the memory device shown in FIG. 2. In FIG. 7, for convenience of description, it is assumed that a memory cell is a Multi-Level Cell (MLC) storing 2-bit data. However, the scope of the present disclosure is not limited thereto, and the memory cell may be a Triple Level Cell (TLC) storing 3-bit data or a Quadruple Level Cell (QLC) storing 4-bit data. The number of data bits stored by the memory cell may be one or more.

The memory device may program selected memory cells to have a threshold voltage corresponding to one of a plurality of program states P1, P2, and P3 by performing one or more program loops PL1 to PLn. Each of the program loops PL1 to PLn may include a program voltage apply step PGM Step, which includes applying a program voltage to a selected word line connected to the selected memory cells, and a program verify step Verify Step which includes determining whether memory cells have been programmed by applying verify voltages.

For example, when a first program loop PL1 is performed, first to third verify voltages V_vfy1 to V_vfy3 may be sequentially applied so as to verify a program state of the selected memory cells after a first program pulse Vpgm1 is applied. Verification on memory cells (of which a target program state is a first program state P1) may be performed by the first verify voltage V_vfy1. Verification on memory cells (of which a target program state is a second program state P2) may be performed by the second verify voltage V_vfy2. Verification on memory cells (of which a target program state is a third program state P3) may be performed by the third verify voltage V_vfy3.

It may be determined that memory cells verify-passed by each of the verify voltages V_vfy1 to V_vfy3 have a target program state. Subsequently, the memory cells may be program-inhibited in a second program loop PL2. For example, a program inhibit voltage may be applied to a bit line connected to the verify-passed memory cells from the second program loop PL2.

A second program pulse Vpgm2 (e.g., higher by a unit voltage ΔVpgm than the first program pulse Vpgm1) may be applied to the selected word line, so as to program the other memory cells except the memory cells program-inhibited in the second program loop PL2. Subsequently, a verify operation may be performed in a manner similar or identical to that of the first program loop PL1. A verify pass may include, for example, the case where a memory cell is read as an off-cell by a corresponding verify voltage.

As described above, when the memory device programs an MLC storing 2-bit data, the memory device may verify memory cells having the respective program states as target program states by using the first to third verify voltages V_vfy1 to V_vfy3.

In the verify operation, a verify voltage may be applied to the selected word line as a word line to which the selected memory cells are connected, and the page buffer shown in FIG. 2 may determine whether memory cells have verify-passed based on a current or voltage flowing through bit lines respectively connected to the selected memory cells.

When the verify operation on the first program state is completed, a voltage level of bit lines connected to the memory cells programmed to the first program state may be increased. Therefore, during the verify operation on the second program state, when bit lines connected to the memory cells programmed to the second program state are precharged, performance of a precharge operation may be deteriorated due to a coupling effect with the bit lines having the increased voltage level.

Thus, in accordance with one embodiment, bit lines may be discharged while performing a latch setting operation, so that performance of a precharge operation of a bit line during the verify operation may be improved.

Figure 8:
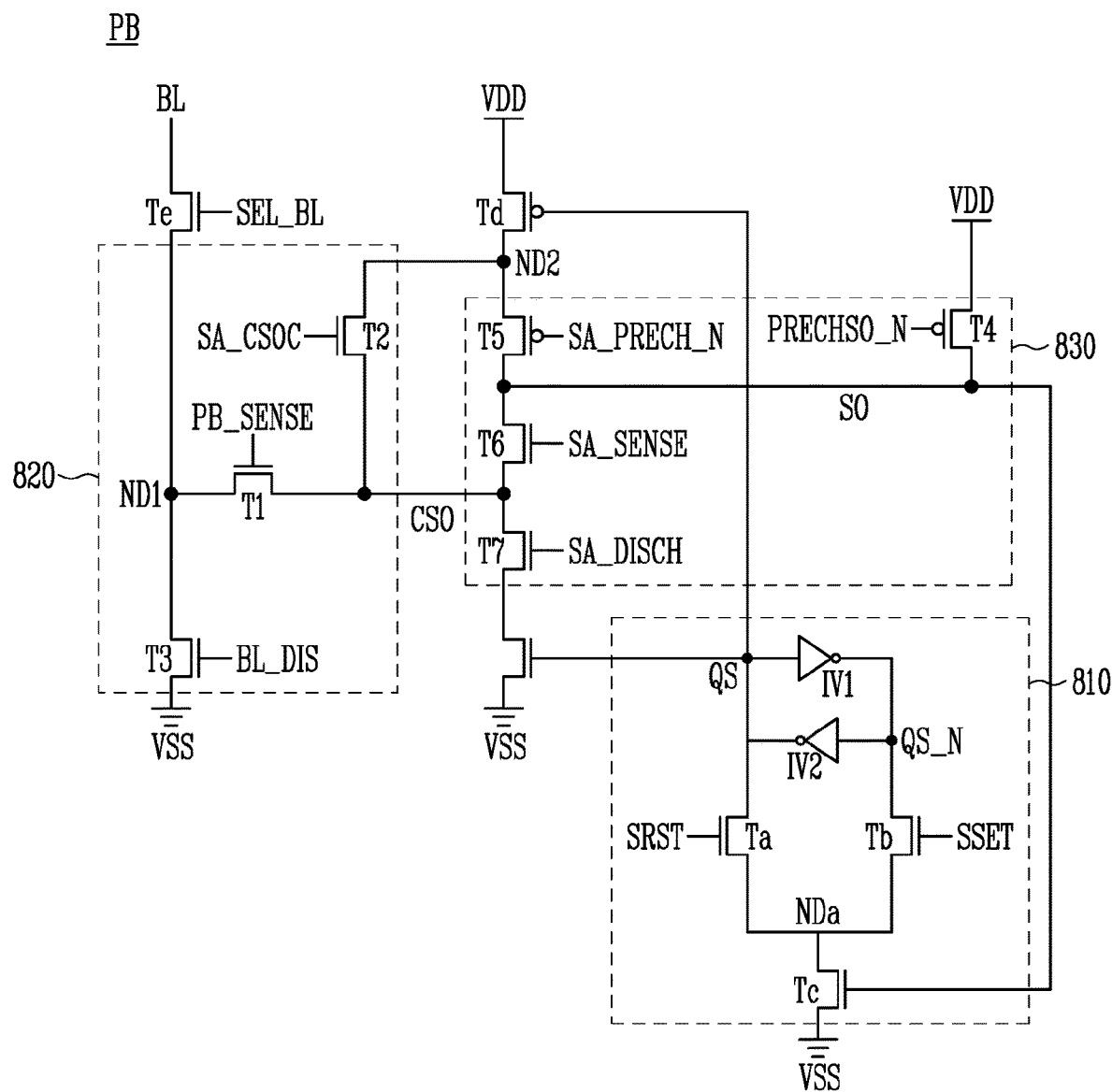
FIG. 8 illustrates an embodiment of a page buffer.

FIG. 8 is a circuit diagram illustrating an embodiment of a page buffer shown in FIG. 2. The page buffer PB shown in FIG. 8 may be any one of the page buffers PB1 to PBm shown in FIG. 2. The page buffers PB1 to PBm shown in FIG. 2 may be designed to have structures similar to one another.

Referring to FIG. 8, the page buffer PB may include a latch 810, a bit line controller 820, and a latch setting circuit 830. The latch 810 may store data sensed from a bit line BL and may include an ath transistor Ta, a bth transistor Tb, a cth transistor Tc, and inverters IV1 and IV2. In an embodiment, the ath transistor Ta, the bth transistor Tb, and the cth transistor Tc may be implemented, for example, with an NMOS transistor. One or more of these transistors may be implemented of a different conductivity type in another embodiment.

The inverters IV1 and IV2 may be connected reversely in parallel between a node QS and a node QS_N. The ath transistor Ta may be connected between the node QS and an ath node NDa to electrically connect the node QS and the ath node NDa in response to a reset signal SRST. The bth transistor Tb may be connected to the node QS_N and the ath node NDa to electrically connect the node QS_N and the ath node NDa in response to a set signal SSET. The cth transistor Tc may be connected between the ath node NDa and a ground power source VSS, and may be turned on according to a potential of a sensing node SO to electrically connected to the ath node NDa and the ground power source VSS.

For example, when the reset signal SRST is applied with a logic high level to the ath transistor Ta in a state in which the sensing node SO is precharged to a high level, the node QS and the node QS_N are respectively initialized to a logic low level and the logic high level. Also, when the set signal SSET is applied with the logic high level to the bth transistor Tb in a state in which the sensing node SO is precharged to the high level, the node QS and the node QS_N are respectively set to the logic high level and the logic low level.

The latch 810 may latch verify data in a verify operation during a program loop. For example, when a potential level of the sensing node SO is changed in the verify operation, the latch 810 generates and latches verify data based on the potential level of the sensing node SO. For example, when a threshold voltage of a target memory cell connected to the bit line BL is lower than a verify voltage, the target memory cell is turned on. Accordingly, the potential level of the sensing node SO is discharged.

When the threshold voltage of the target memory cell connected to the bit line BL is higher than the verify voltage, the target memory cell is turned off. Accordingly, the potential level of the sensing node SO maintains a precharge level (power voltage level). The ath transistor Ta is turned on in response to the reset signal SRST, and the cth transistor Tc is turned on or turned off based on the potential level of the sensing node SO, so that the latch 810 latches the verify data. For example, when the latch 810 latches verify data corresponding to fail as a verify operation result, the node QS has the logic first (e.g., high) level. When the latch 810 latches verify data corresponding to pass as a verify operation result, the node QS has the logic second (e.g., low) level.

After the verify operation, the latch 810 may transmit the latched verify data to the sensing node SO in a current sensing operation.

The bit line controller 820 controls a potential level of the bit line BL to become a program allow level or a program inhibit level, based on a potential of the node QS, in a program operation. Also, the bit line controller 820 controls the potential level of the sensing node SO, based on a current amount of the bit line BL, which is changed according to a program state of a memory cell connected to the bit line BL. This may occur in a sensing operation during a read operation or verify operation.

The bit line controller 820 may include a first transistor T1, a second transistor T2, and a third transistor T3. In an embodiment, the first transistor T1, the second transistor T2, and the third transistor T3 may be implemented with an NMOS transistor. One or more of these transistors may be implemented with a different conductivity type in another embodiment.

The first transistor T1 may be connected between a first node ND1 connected to the bit line BL and a common sensing node CSO. The first transistor T1 electrically connects the first node ND1 and the common sensing node CSO in response to a page buffer sensing signal PB_SENSE.

The second transistor T2 may be connected between a second node ND2 connected to a power voltage VDD and the common sensing node CSO. The second transistor T2 may supply the power voltage VDD supplied through a dth transistor Td to the common sensing node CSO in response to a control signal SA_CSOC.

The third transistor T3 may be connected between the first node ND1 and the ground power source VSS. The third transistor T3 may apply the ground power source VSS to the first node ND1 in response to a bit line discharge signal BL_DIS.

The dth transistor Td is connected in series between the power voltage VDD and the second node ND2, and may be turned on in response to the node QS of the latch 810. In an embodiment, the dth transistor Td may be implemented with a PMOS transistor. In another embodiment, the dth transistor Td may be implemented using a different conductivity type transistor.

An eth transistor Te is connected between the bit line BL and the first node ND1, and electrically connects the bit line BL and the first node ND1 in response to a bit line select signal SEL_BL. In an embodiment, the eth transistor Te may be implemented with an NMOS transistor. In another embodiment, the eth transistor Te may be implemented using a different conductivity type transistor.

In an embodiment, the bit line controller 820 may discharge the bit line BL while a latch setting operation of setting data stored in the latch 810 is being performed. Also, in an embodiment, the bit line controller 820 may precharge the bit line BL, when the latch setting operation is completed.

The latch setting circuit 830 may set data stored in the latch 810 in a verify operation on a plurality of memory cells. The latch setting circuit 830 may include a fourth transistor T4, a fifth transistor T5, a sixth transistor T6, and a seventh transistor T7. In an embodiment, the fourth transistor T4 and the fifth transistor T5 may be implemented with a PMOS transistor. In addition, the sixth transistor T6 and the seventh transistor T7 may be implemented with an NMOS transistor. One or more of these transistors may be implemented as ones of different conductivity types in another embodiment.

The fourth transistor T4 may be connected between the sensing node SO and the power voltage VDD. The fourth transistor T4 may apply the power voltage VDD to the sensing node SO in response to a sensing node precharge signal PRECHSO_N.

The fifth transistor T5 may be connected between the sensing node SO and the second node ND2. The fifth transistor T5 may be turned on in response to a precharge signal SA_PRECH_N.

The sixth transistor T6 may be connected between the sensing node SO and the common sensing node CSO. The sixth transistor T6 may electrically connect the sensing node SO and the common sensing node CSO in response to a sensing signal SA_SENSE.

The seventh transistor T7 may be connected between the common sensing node CSO and the node QS of the latch 810. The seventh transistor T7 electrically connects the sensing node CSO and the node QS in response to a discharge signal SA_DISCH.

In an embodiment, the latch setting circuit 830 may perform a latch setting operation in a verify operation on a plurality of memory cells. In an embodiment, the latch setting operation may include storing a first logic value in the latch 810 of each of page buffers connected to bit lines on which a verify operation on a second program state is to be performed. The verify operation on the second program state may be performed after a verify operation on a first program state is completed. Also, the latch setting operation may include an operation of storing an inverted first logic value in the latch 810 of each of page buffers connected to bit lines on which the verify operation on the second program state is not performed among a plurality of bit lines.

The latch setting operation may be performed before an operation of precharging a bit line is performed, in the verify operation on the second program state which is performed after the verify operation on the first program state. For example, when the page buffer PB is connected to memory cells on which a verify operation on a program state is to be currently performed, the latch setting circuit 830 may set a first value (e.g., 1) to the node QS_N of the latch 810. When the page buffer PB is not connected to the memory cell on which the verify operation on the program state is to be currently performed, the latch setting circuit 830 may set a second value (e.g., 0) to the node QS_N of the latch 810.

Figure 9A:
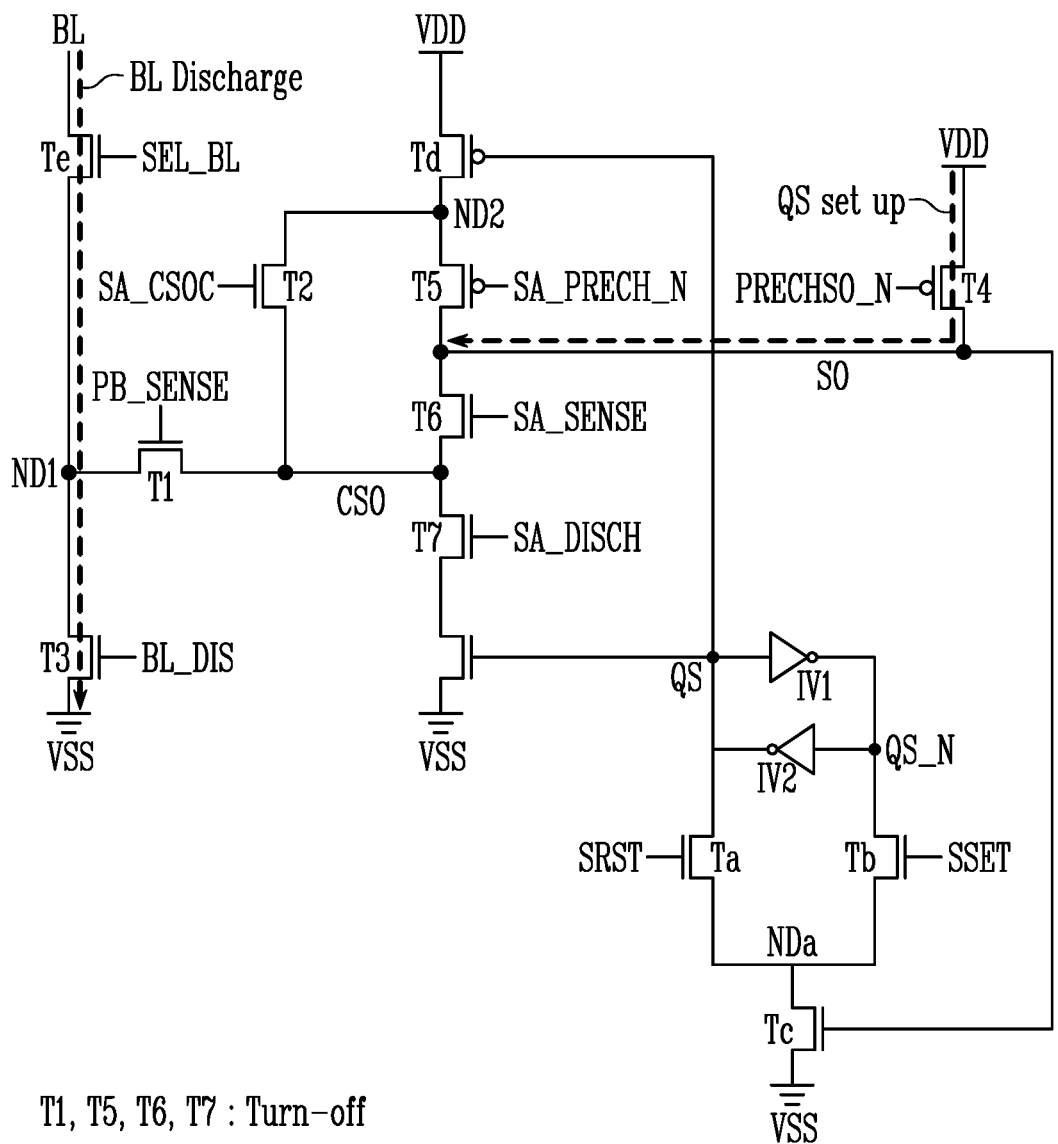
FIGS. 9A and 9B illustrate examples of a latch setting operation and an operation of discharging a bit line.
Figure 9B:
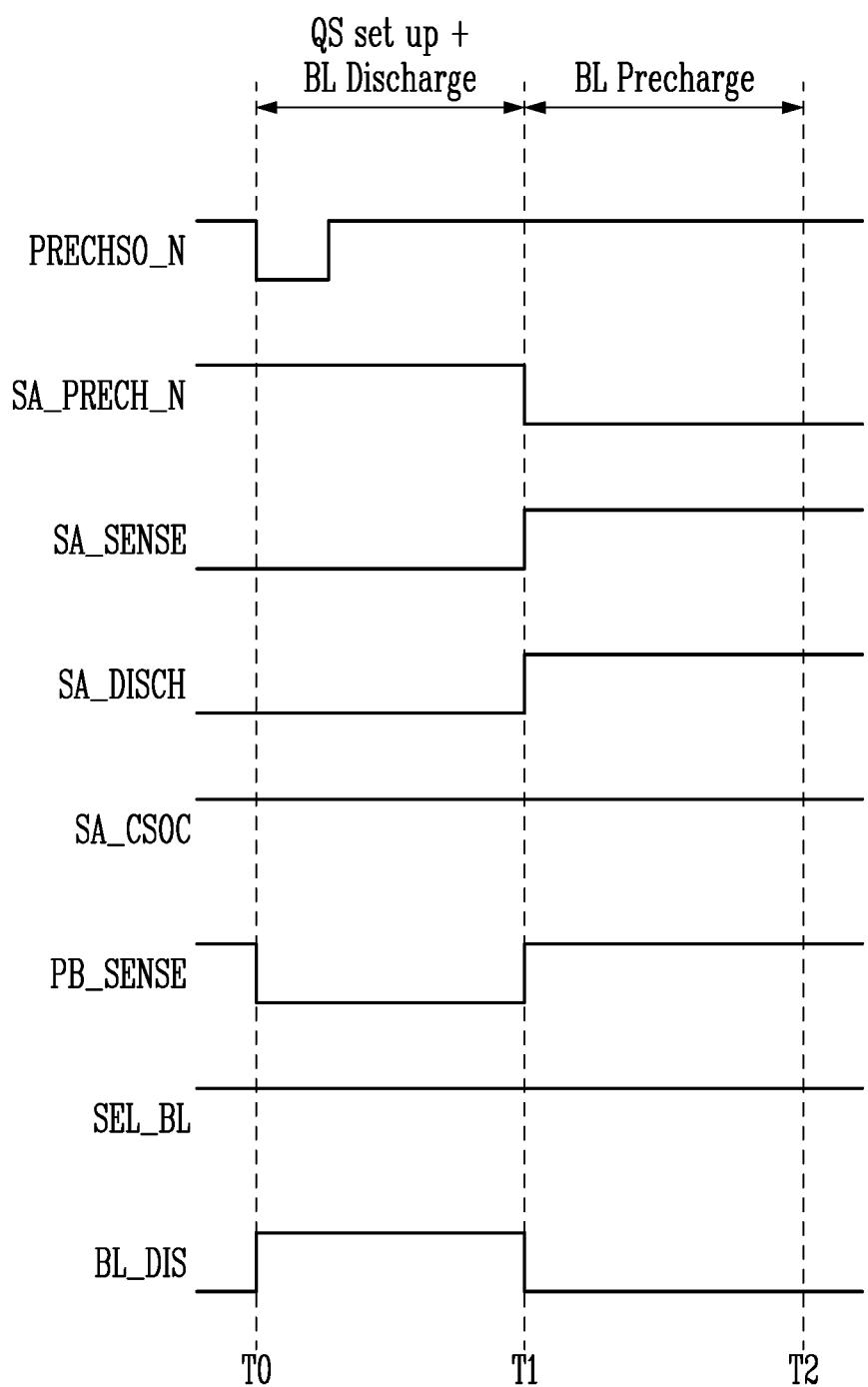

FIG. 9A is a circuit diagram illustrating an embodiment of a page buffer for performing a latch setting operation and an operation of discharging a bit line. FIG. 9B is a waveform diagram illustrating the latch setting operation and the operation of discharging the bit line in accordance with an embodiment. The page buffer PB shown in FIG. 9A may be the page buffer PB shown in FIG. 8.

In FIG. 9B, a latch setting operation QS set up and an operation BL Discharge for discharging a bit line during a verify operation are performed in a period T0 to T1, and an operation BL Precharge for precharging the bit line during the verify operation may be performed in a period T1 to T2.

In period T0 to T1, the page buffer PB may perform the latch setting operation QS set up. In an embodiment, the page buffer PB may turn off the fifth transistor T5, the sixth transistor T6, and the seventh transistor T7. For example, the page buffer PB may increase the precharge signal SA_P-RECH_N applied to the fifth transistor T5 to a turn-off voltage. Also, the page buffer BP may decrease the sensing signal SA_SENSE and the discharge signal SA_DISCH, which are respectively applied to the sixth transistor T6 and the seventh transistor T7, to the turn-off voltage.

In an embodiment, the page buffer PB may perform the latch setting operation QS set up by applying the power voltage VDD to the sensing node SO through the fourth transistor T4, and may transfer the power voltage VDD to the node QS of the latch 810 through the sensing node SO. For example, the page buffer PB may decrease the sensing node precharge signal PRECHSO_N applied to the fourth transistor T4 to a turn-on voltage. The page buffer PB may apply the power voltage VDD to the sensing node SO according to the sensing node precharge signal PRECH-SO_N. Also, the page buffer PB may transfer the power voltage VDD to the node QS of the latch 810 through the sensing node SO, and may set a value of the node QS_N as 1 based on the power voltage VDD.

Also, the page buffer PB may discharge the bit line BL while performing the latch setting operation QS set up. In an embodiment, the page buffer PB may turn off the first transistor T1 and discharge the bit line BL by applying the ground power source VSS to the first node ND1 through the third transistor T3. For example, the page buffer PB may decrease the page buffer sensing signal PB_SENSE applied to the first transistor T1 to the turn-off voltage. Also, the page buffer PB may increase the bit line discharge signal BL_DIS applied to the third transistor T3 to the turn-on voltage. The page buffer PB may discharge the bit line BL by applying the ground power source VSS to the first node ND1 connected to the bit line BL according to the bit line discharge signal BL_DIS.

In period T1 to T2, the page buffer PB may precharge the bit line BL. For example, the page buffer PB may precharge the bit line after the latch setting operation QS set up and the operation BL Discharge of discharging the bit line are completed. An embodiment of the operation BL Precharge of precharging the bit line will be described in detail with reference to FIG. 11.

Accordingly, in accordance with one embodiment, the latch setting operation and the operation of discharging the bit line are simultaneously performed, so that the performance of an operation of discharging a bit line during a verify operation can be improved.

Figure 10A:
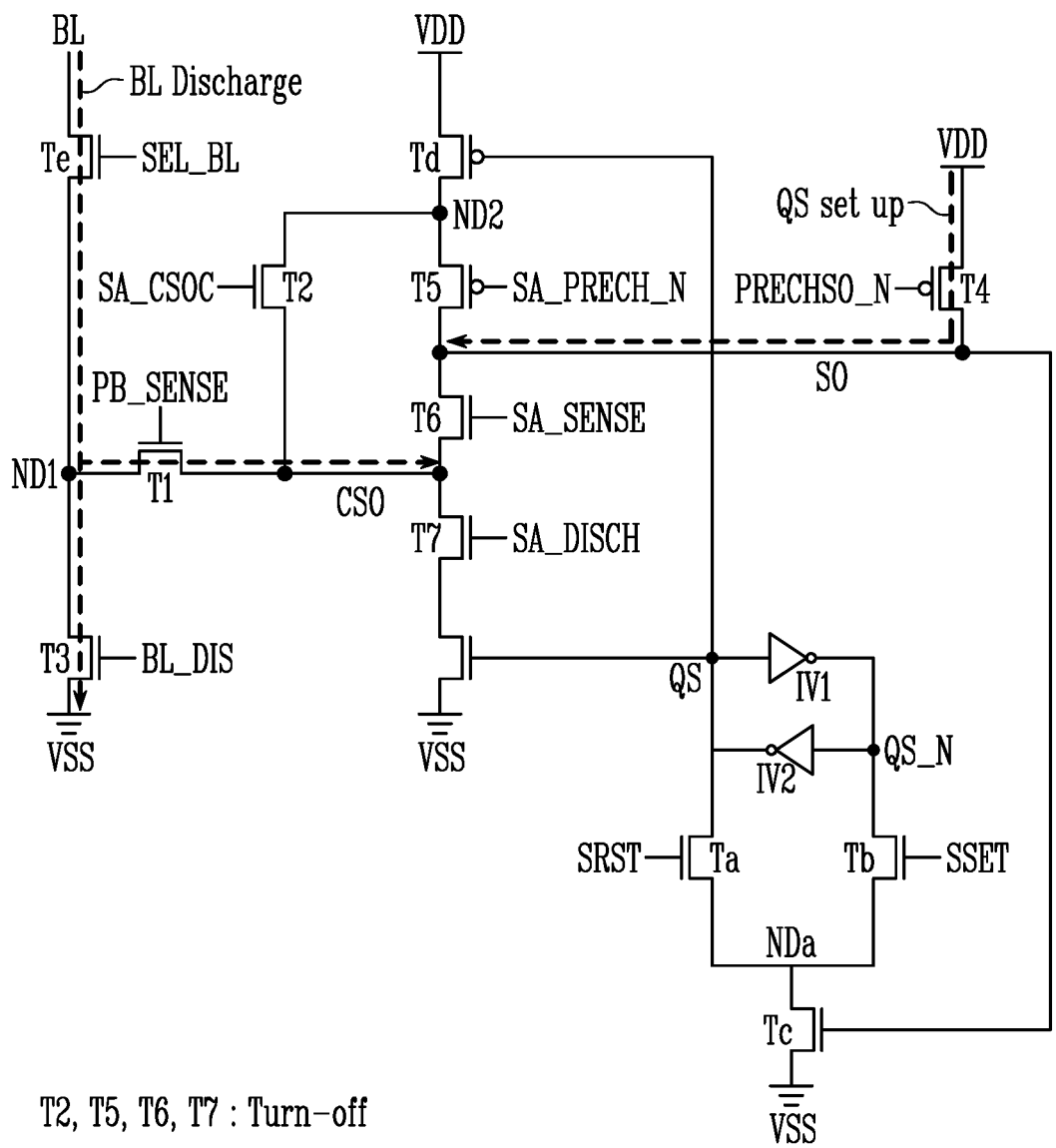
FIGS. 10A and 10B illustrate additional examples of a latch setting operation and an operation of discharging a bit line.
Figure 10B:
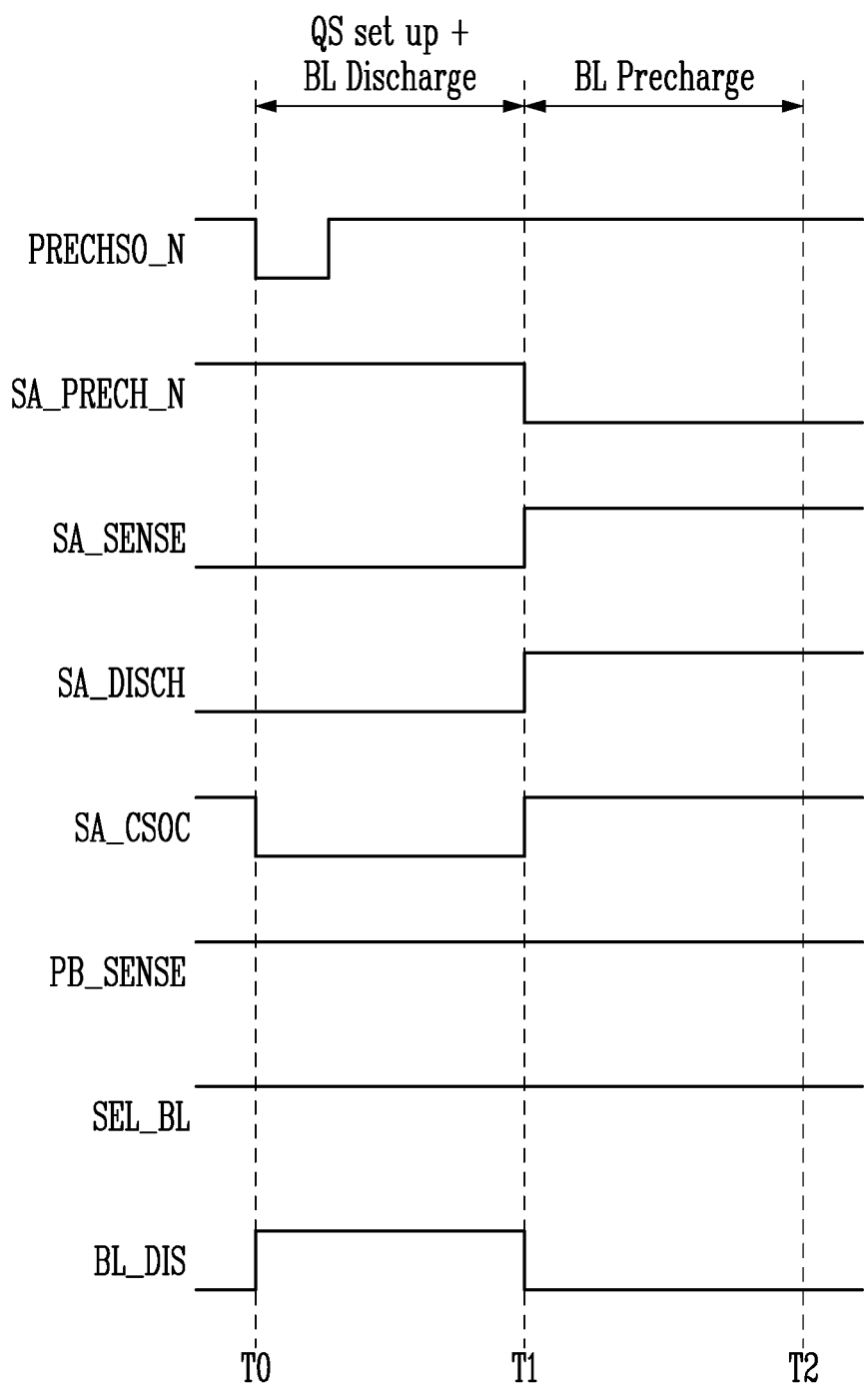

FIG. 10A is a circuit diagram illustrating an embodiment of a page buffer on which a latch setting operation and an operation of discharging a bit line are performed during a verify operation. FIG. 10B is an example of a waveform diagram illustrating the latch setting operation and the operation of discharging the bit line during the verify operation. In FIGS. 10A and 10B, an operation BL Discharge of discharging a bit line may be different from that shown in FIGS. 9A and 9B. Also, the page buffer shown in FIG. 10A may be the page buffer PB shown in FIG. 8.

In FIG. 10B, a latch setting operation QS set up and an operation BL Discharge of discharging a bit line during a verify operation may be performed in period T0 to T1. An operation BL Precharge of precharging the bit line during the verify operation may be performed in period T1 to T2.

In period T0 to T1, the page buffer PB may perform the latch setting operation QS set up. In an embodiment, the page buffer PB may turn off the fifth transistor T5, the sixth transistor T6, and the seventh transistor T7. For example, the page buffer PB may increase the precharge signal SA_P-RECH_N applied to the fifth transistor T5 to a turn-off voltage. Also, the page buffer BP may decrease the sensing signal SA_SENSE and the discharge signal SA_DISCH, which are respectively applied to the sixth transistor T6 and the seventh transistor T7, to the turn-off voltage.

In an embodiment, the page buffer PB may perform the latch setting operation QS set up by applying the power voltage VDD to the sensing node SO through the fourth transistor T4, and may transfer the power voltage VDD to the node QS of the latch 810 through the sensing node SO. For example, the page buffer PB may decrease the sensing node precharge signal PRECHSO_N applied to the fourth transistor T4 to a turn-on voltage. The page buffer PB may apply the power voltage VDD to the sensing node SO according to the sensing node precharge signal PRECH-SO_N. Also, the page buffer PB may transfer the power voltage VDD to the node QS of the latch 810 through the sensing node SO, and may set a value of the node QS_N as '1,' based on the power voltage VDD.

Also, the page buffer PB may discharge the bit line BL while performing the latch setting operation QS set up. In an embodiment, the page buffer PB may turn off the second transistor T2 and may discharge the bit line BL by applying the ground power source VSS to the first node ND1 through the third transistor T3. For example, the page buffer PB may decrease the control signal SA_CSOC applied to the second transistor T2 to the turn-off voltage. Also, the page buffer PB may increase the bit line discharge signal BL_DIS applied to the third transistor T3 to the turn-on voltage. The page buffer PB may discharge the bit line BL by applying the ground power source VSS to the first node ND1 connected to the bit line BL according to the bit line discharge signal BL_DIS.

In period T1 to T2, the page buffer PB may precharge the bit line BL. For example, the page buffer PB may precharge the bit line after the latch setting operation QS set up and the operation BL Discharge of precharging the bit line are completed. An example of operation BL Discharge of precharging the bit line will be described with reference to FIG. 11.

Accordingly, in accordance with one embodiment, the latch setting operation and the operation of discharging the bit line are simultaneously performed, so that the performance of an operation of discharging a bit line during a verify operation can be improved.

Figure 11:
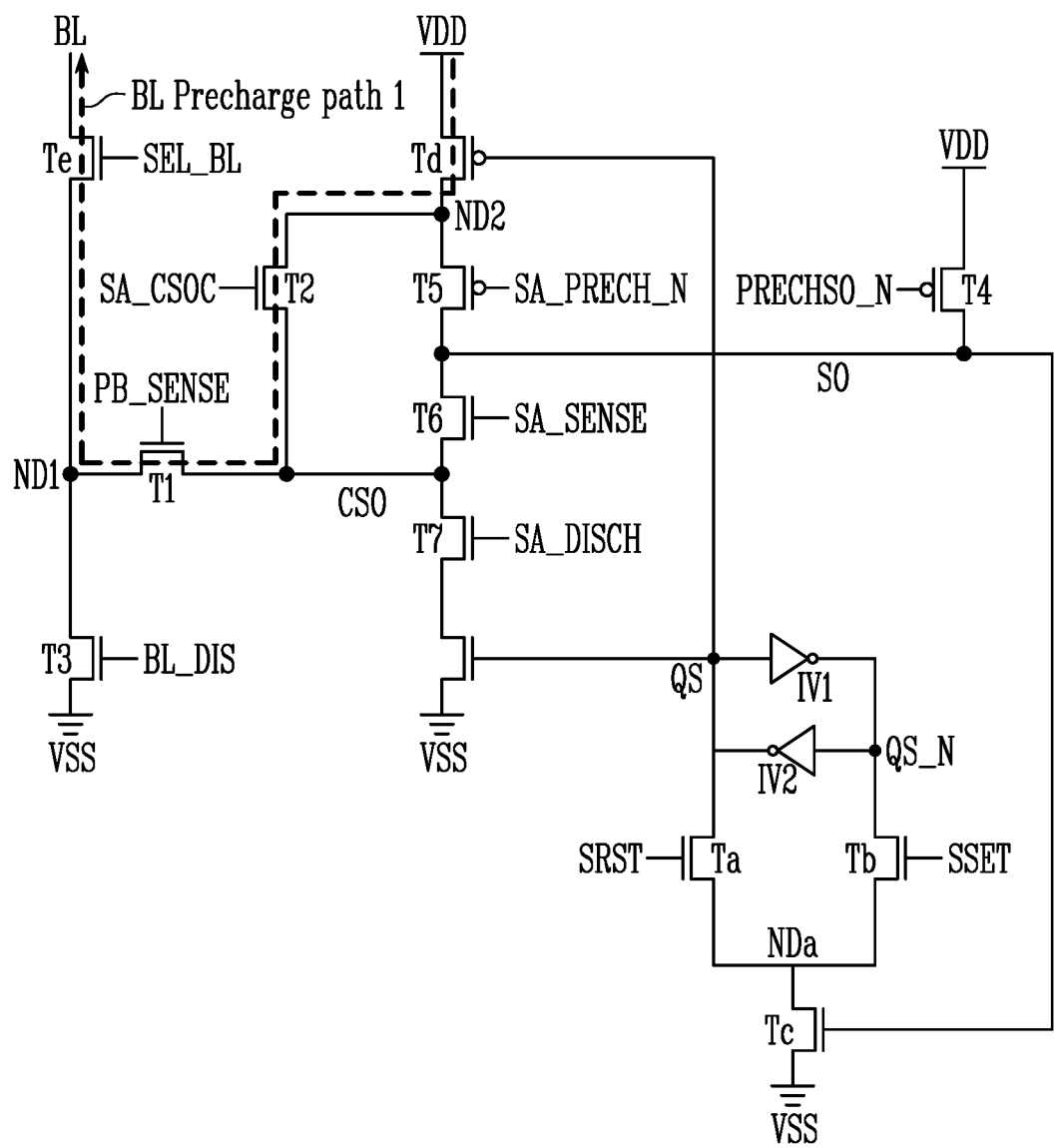
FIG. 11 illustrates an embodiment of an operation of precharging a bit line in a verify operation.

FIG. 11 is a circuit diagram illustrating an operation of precharging a bit line in a verify operation in accordance with an embodiment. A page buffer PB shown in FIG. 11 may be the page buffer PB shown in FIG. 8.

Referring to FIG. 11, the page buffer PB may precharge a bit line after a latch setting operation and an operation of discharging the bit line are completed. In an embodiment, the page buffer PB may precharge the bit line BL through a first precharge path BL Precharge path 1 using the first transistor T1 and the second transistor T2. In an embodiment, the page buffer PB may turn off the third transistor T3. Also, the page buffer PB may precharge the bit line BL by applying the power voltage VDD to the first node ND1 through the first transistor T1 and the second transistor T2.

For example, the page buffer PB may decrease the bit line discharge signal BL_DIS applied to the third transistor T3 to the turn-off voltage. Also, the page buffer PB may increase the page buffer sensing signal PB_SENSE and the control signal SA_CSOC (which are respectively applied to the first transistor T1 and the second transistor T2) to the turn-on voltage. The page buffer PB may precharge the bit line BL by supplying the power voltage VDD supplied through the dth transistor Td to the bit line BL through the common sensing node CSO and the first node ND1.

Figure 12:
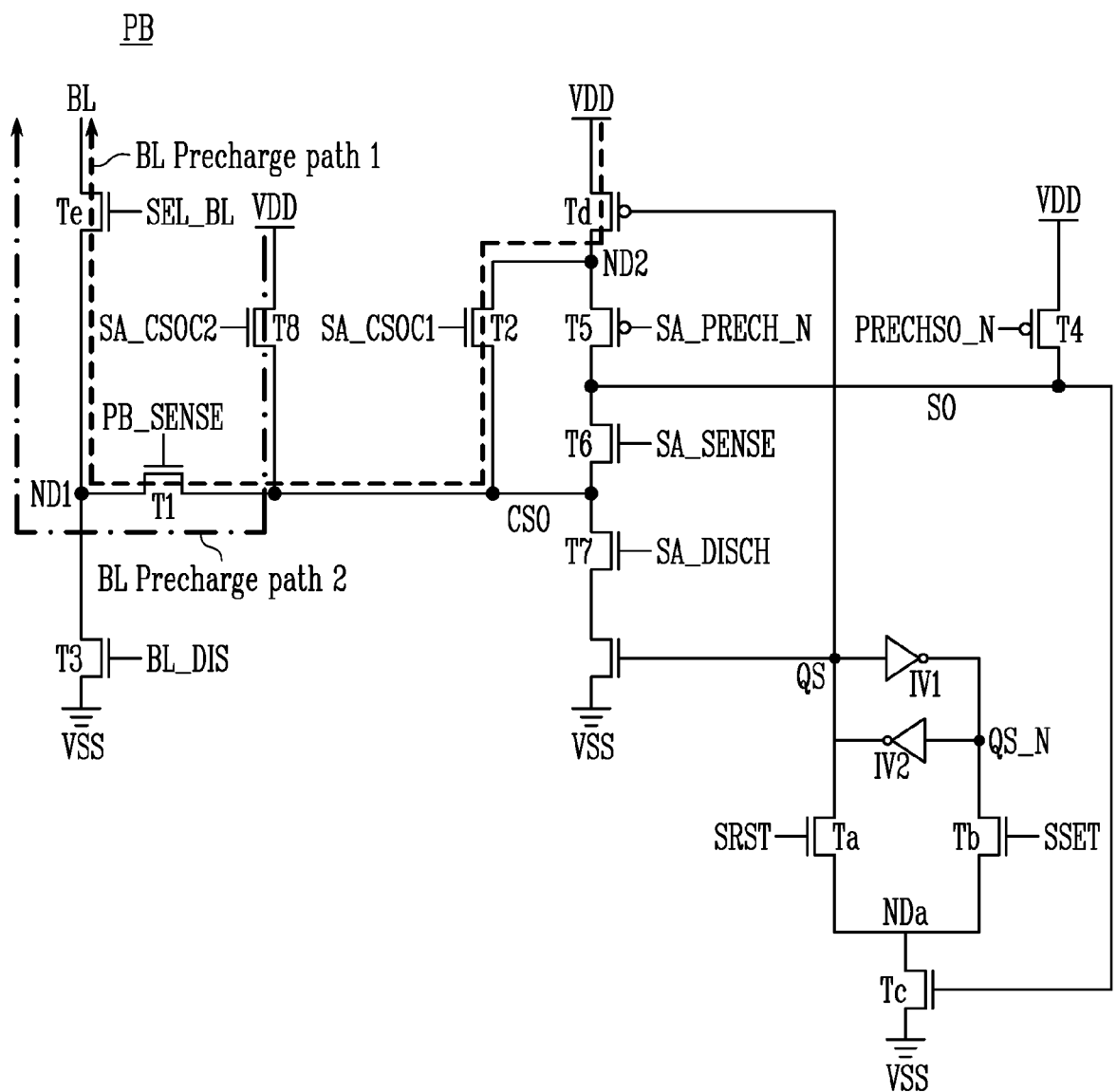
FIG. 12 illustrates an embodiment of an operation of precharging a bit line in a read operation.

FIG. 12 is a circuit diagram illustrating an operation of precharging a bit line in a read operation in accordance with an embodiment. A page buffer PB shown in FIG. 12 may be any one of the page buffers PB1 to PBm shown in FIG. 2. Also, in FIG. 12, a control signal SA_CSOC1 applied to the second transistor T2 may be equal to the SA_CSOC described with reference to FIG. 11.

Referring to FIG. 12, the page buffer PB may include an eighth transistor T8 connected between the power voltage VDD and the common sensing node CSO. The eighth transistor T8 may supply the power voltage VDD to the common sensing node CSO in response to a control signal SA_CSOC2.

In an embodiment, in a verify operation on a plurality of memory cells, the page buffer PB may precharge the bit line BL through the first precharge path BL Precharge path 1 using the first transistor T1 and the second transistor T2. In an embodiment, the page buffer PB may turn off the third transistor T3 and the eighth transistor T8. Also, the page buffer PB may precharge the bit line BL by applying the power voltage VDD to the first node ND1 through the first transistor T1 and the second transistor T2.

In an embodiment, in a read operation on a plurality of memory cells, the page buffer PB may precharge the bit line BL through a second precharge path BL Precharge path 2 using the first transistor T1 and the eighth transistor T8.

In an embodiment, in the read operation on the plurality of memory cells, the page buffer PB may turn off the second transistor T2 and the third transistor T3. Also, the page buffer PB may precharge the bit line BL by applying the power voltage VDD to the first node ND1 through the first transistor T1 and the eighth transistor T8. For example, the page buffer PB may decrease the control signal SA_CSOC1 and the bit line discharge signal BL_DIS, which are respectively applied to the second transistor T2 and the third transistor T3, to the turn-off voltage. Also, the page buffer PB may increase the page buffer sensing signal PB_SENSE and the control signal SA_CSOC2, which are respectively applied to the first transistor T1 and the eighth transistor T8, to the turn-on voltage. The page buffer PB may precharge the bit line BL by supplying the power voltage VDD supplied through the eighth transistor T8 to the bit line BL through the common sensing node CSO and the first node ND1.

Thus, in accordance with one embodiment, precharge paths in a verify operation and a read operation are set different from each other, so that the read operation can be smoothly performed even when the latch is insufficient.

Figure 13:
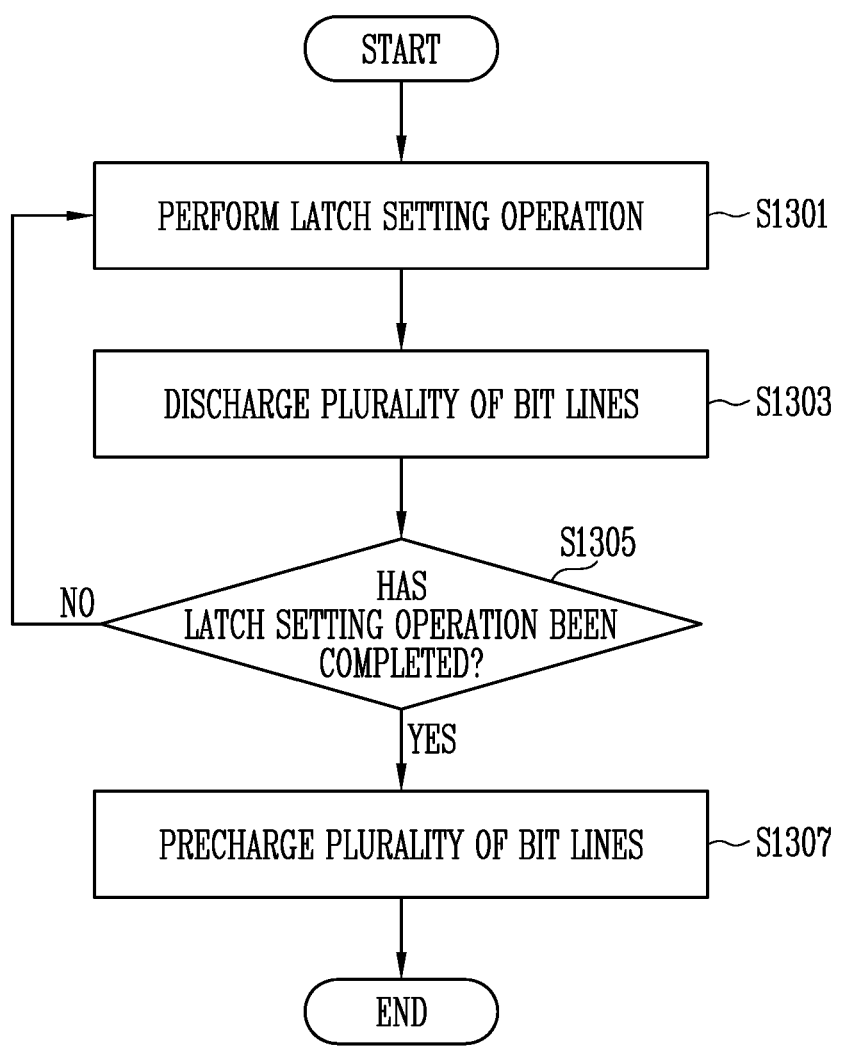
FIG. 13 illustrates an embodiment of an operating method of a memory device.

FIG. 13 is a flowchart illustrating an operating method of a memory device in accordance with an embodiment. The operating method shown in FIG. 13 may be performed by, for example, the memory device 100 shown in FIG. 2.

Referring to FIG. 13, in operation S1301, the memory device 100 may perform a latch setting operation of setting data stored in a latch.

In operation S1303, the memory device 100 may discharge a plurality of bit lines connected to a plurality of memory cells while performing the latch setting operation.

In operation S1305, the memory device 100 may determine whether the latch setting operation has been completed. When the latch setting operation is not completed based on a determination result in operation S1305, the memory device 100 may perform the latch setting operation until the latch setting operation is completed. When the latch setting operation is completed based on a determination result in operation S1305, then, in operation S1307, the memory device 100 may precharge the plurality of bit lines.

Figure 14:
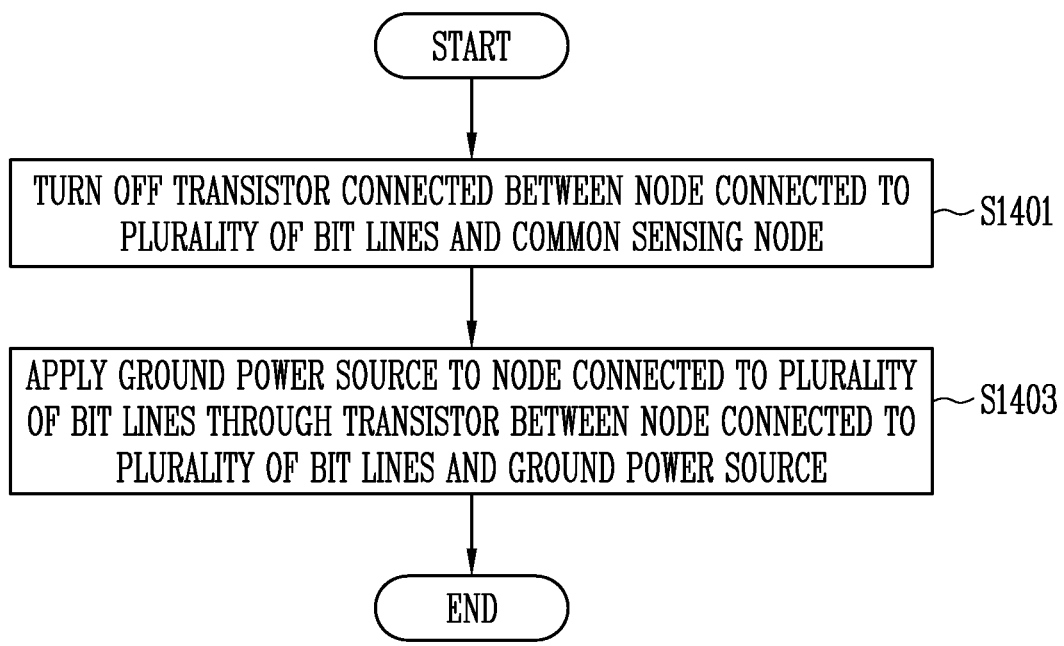
FIG. 14 illustrates an embodiment of a method for discharging a bit line.

FIG. 14 is a flowchart illustrating a method for discharging a bit line in accordance with an embodiment. The method shown in FIG. 14 may be performed by, for example, the memory device 100 shown in FIG. 2.

Referring to FIG. 14, in operation S1401, the memory device 100 may turn off a transistor connected between a node connected to a plurality of bit lines and a common sensing node. In operation S1403, the memory device 100 may apply a reference (e.g., ground) power source to the node connected to the plurality of bit lines through the transistor connected between the node connected to the plurality of bit lines and the ground power source.

Figure 15:
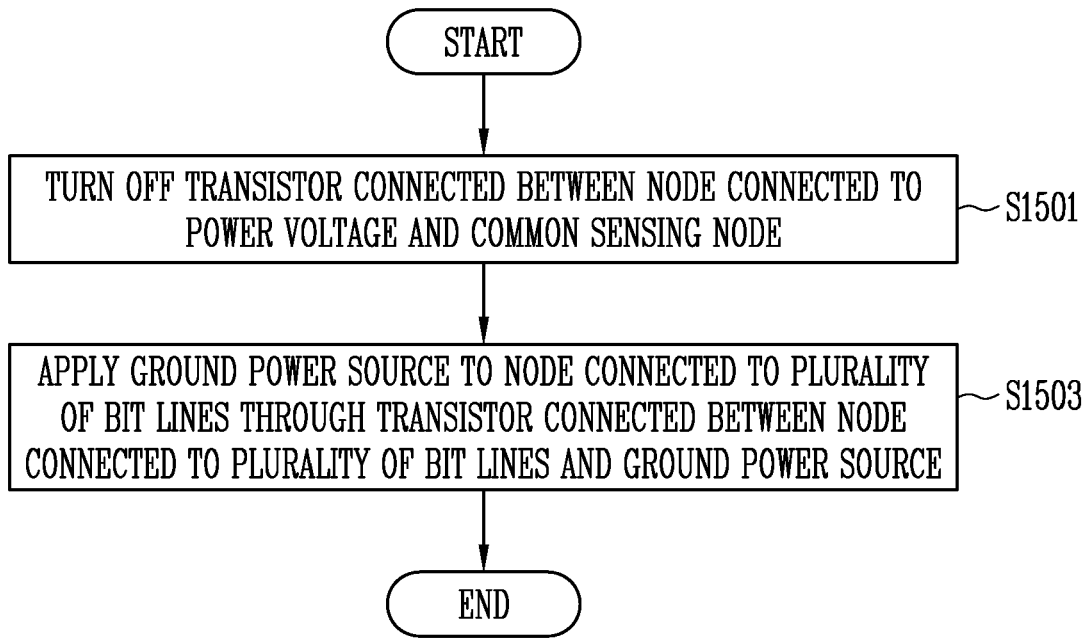
FIG. 15 illustrates another embodiment of a method for discharging a bit line.

FIG. 15 is a flowchart illustrating a method for discharging a bit line in accordance with an embodiment. The method shown in FIG. 15 may be performed by, for example, the memory device 100 shown in FIG. 2, and may be a method for discharging a bit line which is different from the method shown in FIG. 14.

Referring to FIG. 15, in operation S1501, the memory device 100 may turn off a transistor connected between a node connected to a power voltage and a common sensing node. In operation S1503, the memory device 100 may apply a reference (e.g., ground) power source to a node that is connected to a plurality of bit lines. The reference power source may be connected to the plurality of bit lines through a transistor, which is connected between the node that is connected to the plurality of bit lines and the ground power source.

In accordance with one embodiment, an apparatus may include a controller connected to at least one page buffer. The at least one page buffer may be connected to memory cells through one or more corresponding bit lines. The controller configured to generate a first signal to control a latch to store data sensed from the bit line, a second signal to control a latch setting operation, which includes setting data stored in the latch in a verify operation on memory cells, and a third signal to discharge the bit line while the latch setting operation is being performed. The latch, latch setting operation and discharge operation may be those described relative to any one of the embodiments described herein. Accordingly, the first through third signals may be any of the control signals, commands, or instructions described relative to the embodiments herein, including but not limited to the embodiments of FIGS. 8 to 12. The apparatus may be, for example, a memory device, host, page buffer, or any of the other circuits or logic described herein.

Figure 16:
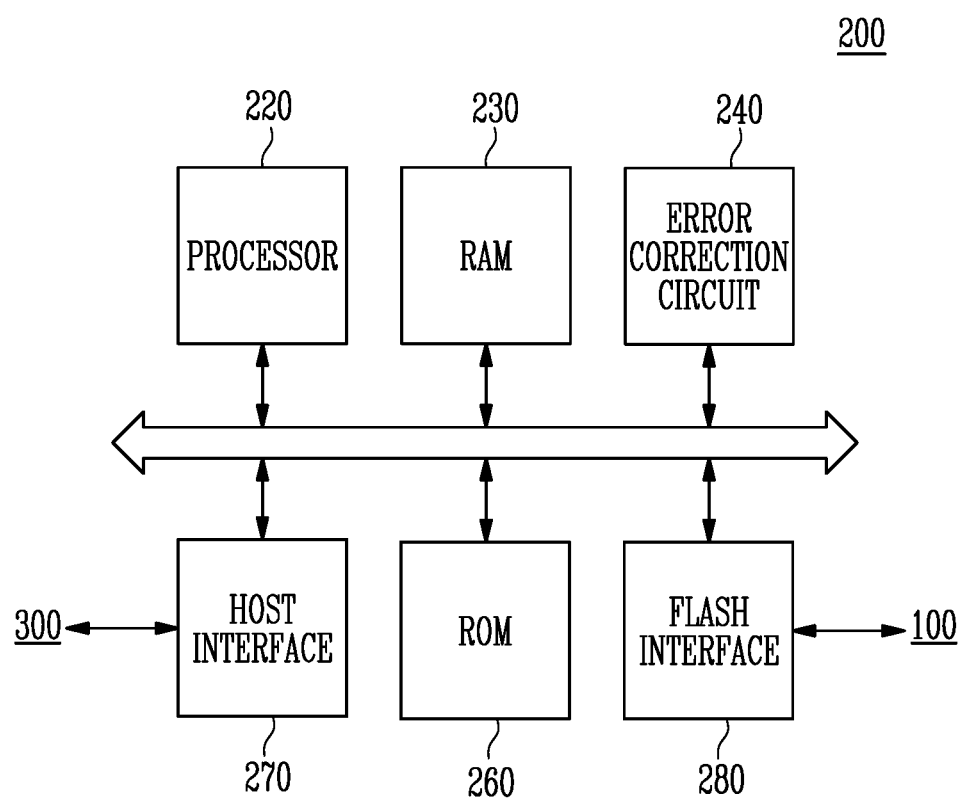
FIG. 16 illustrates an embodiment of a memory controller.

FIG. 16 is a diagram illustrating an embodiment of a memory controller shown in FIG. 1. Referring to FIGS. 1 and 16, the memory controller 200 may include a processor 220, a RAM 230, an error correction circuit 240, ROM 260, a host interface 270, and a flash interface 280.

The processor 220 may control overall operations of the memory controller 200.

The RAM 230 may be used, for example, as a buffer memory, a cache memory, a working memory, etc. of the memory controller 200.

The error correction circuit 240 may perform error correction. In one embodiment, the error correction circuit 240 may perform error correction code (ECC) encoding on data to be written to the memory device through the flash interface 280. The ECC-decoded data may be transferred to the memory device through the flash interface 280. The error correction circuit 240 may perform ECC decoding on data received from the memory device through the flash interface 280. As an example, the error correction circuit 240 may be included as a component of the flash interface 280 in the flash interface 280.

The ROM 260 may store various forms of information to support operation of the memory controller 200. This information may be stored, for example, in the form of firmware.

The memory controller 200 may communicate with an external device (e.g., the host 300, an application processor, or the like) through the host interface 270. The memory controller 200 may communicate with the memory device 100 through the flash interface 280. The memory controller 200 may transmit a command CMD, an address ADDR, a control signal CTRL, and/or other information to the memory device 100 through the flash interface 280, and may receive data DATA. The flash interface 280 may include, for example, a NAND interface.

Figure 17:
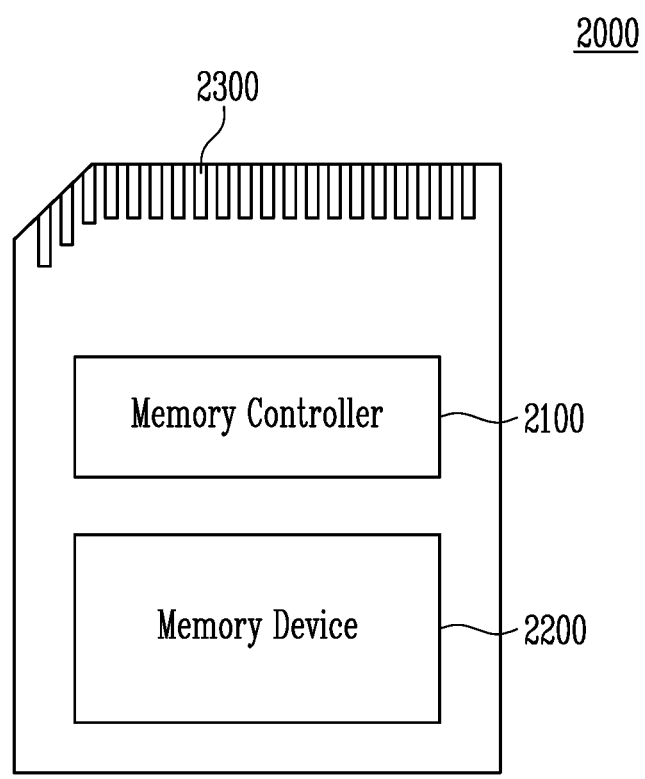
FIG. 17 illustrates an embodiment of a memory card system to which a storage device may be applied.

FIG. 17 is a block diagram illustrating a memory card system to which the storage device is applied in accordance with an embodiment. Referring to FIG. 17, the memory card system 2000 includes a memory controller 2100, a memory device 2200, and a connector 2300.

The memory controller 2100 is connected to the memory device 2200 in order to access the memory device 2200. For example, the memory controller 2100 may control read, write, erase, and background operations of the memory device 2200. The memory controller 2100 may serve as an interface between the memory device 2200 and a host Host. The memory controller 2100 drives firmware for controlling the memory device 2200, and may be implemented in a manner similar or identical to the memory controller 200 described with reference to FIG. 1. In one embodiment, the memory device 2200 may be implemented in a manner similar or identical to the memory device 100 described with reference to FIG. 2.

The memory controller 2100 may include various components, such as a Random Access Memory (RAM), a processing unit, a host interface, a memory interface, and an ECC circuit.

The memory controller 2100 may communicate with an external device through the connector 2300. In one embodiment, the memory controller 2100 may communicate with the external device (e.g., the host) according to one or more communication protocols. Examples include a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 2300 may be defined by at least one of the above-described various communication protocols.

The memory device 2200 may be implemented with various nonvolatile memory devices. Examples include an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device in order to constitute a memory card. Examples of the memory card include a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 18:
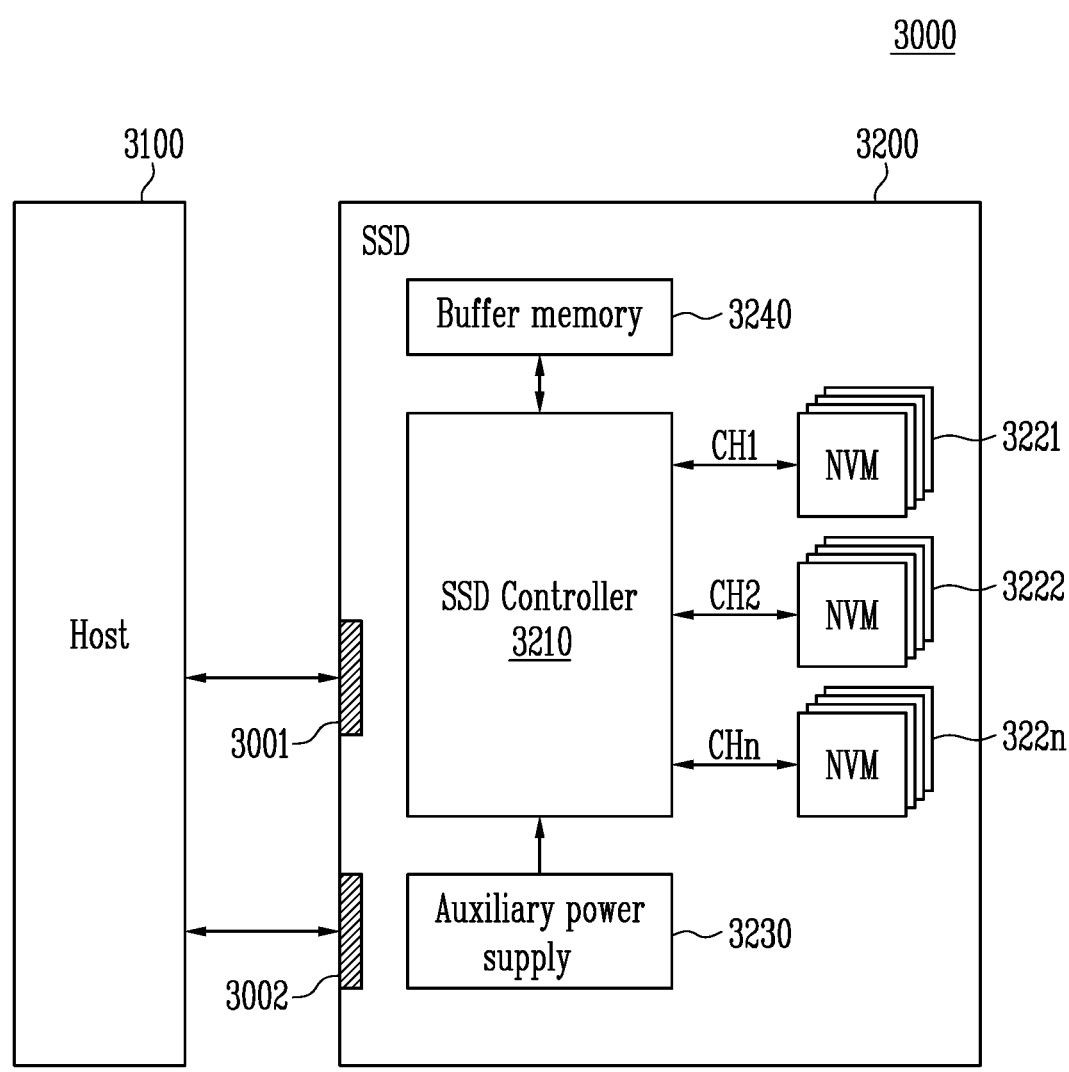
FIG. 18 illustrates an embodiment of a Solid State Drive (SSD) system to which a storage device may be applied.

FIG. 18 is a block diagram illustrating a Solid State Drive (SSD) system to which the storage device may be applied in accordance with an embodiment. Referring to FIG. 18, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1. The SSD controller 3210 may control the plurality of flash memories 3221 to 322n in response to a signal SIG received from the host 3100. For example, the signal SIG may be a signal based on an interface between the host 3100 and the SSD 3200. The signal SIG may be a signal defined by at least one interface, examples of which include a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power PWR input from the host 3100 and may charge the power PWR. When the supply of power from the host 3100 deviates from a predetermined state (e.g., is not smooth or does not conform to a desired waveform), the auxiliary power supply 3230 may provide power of the SSD 3200. The auxiliary power supply 3230 may be located in the SSD 3200 or outside of the SSD 3200. In one embodiment, the auxiliary power supply 3230 may be located on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, and/or may temporarily store meta data (e.g., a mapping table) of the flash memories 3221 to 322n. The buffer memory 3240 may include one or more types of volatile memories. Examples include a DRAM, an SDRAM, a DDR SDRAM, an LPDDR SDRAM, and a GRAM or nonvolatile memories such as a FRAM, a ReRAM, an STT-MRAM, and a PRAM.

FIG. 19 is a block diagram illustrating a user system to which the storage device may be applied in accordance with an embodiment. Referring to FIG. 19, the user system 4000 includes an application processor 4100, a memory module 4200, a network module 4300, a storage module 4400, and a user interface 4500.

The application processor 4100 may drive components included in the user system 4000, an operating system (OS), a user program, or the like. For example, the application processor 4100 may include controllers for controlling components included in the user system 4000, interfaces, a graphic engine, and the like. In one embodiment, the application processor 4100 may be provided as a System-on-Chip (SoC).

The memory module 4200 may operate, for example, as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In one embodiment, the application processor 4100 and the memory module 4200 may be provided as one semiconductor package, e.g., a Package-on-Package (PoP).

The network module 4300 may communicate with one or more external devices, and may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 4300 may be included, for example, in the application processor 4100.

The storage module 4400 may store data, for example, received from the application processor 4100. In one embodiment, the storage module 4400 may transmit data stored therein to the application processor 4100. In one embodiment, the storage module 4400 may be implemented with a nonvolatile semiconductor memory device. Examples include a Phase-change RAM (PRAM), a Magnetic RAM (MRAM), a Resistive RAM (RRAM), a NAND flash, a NOR flash, or a NAND flash having a three-dimensional structure. The storage module 4400 may be provided, for example, as a removable drive such as a memory card of the user system 4000 or an external drive.

Exemplarily, the storage module 4400 may include a plurality of nonvolatile memory devices, which may operate in a manner similar or identical to the memory device 100 described with reference to FIG. 1. In one embodiment, the storage module 4400 may operate in a manner similar or identical to the storage device 50 of FIG. 1.

The user interface 4500 may include interfaces for inputting data or commands to the application processor 4100 or outputting data to an external device. The user interface 4500 may include one or more user input interfaces. Examples include a keyboard, a keypad, a button, a touch panel, a touch screen, a touch pad, a touch ball, a camera, a microphone, a gyroscope sensor, a vibration sensor and a piezoelectric element. The user interface 4500 may include one or more user output interfaces. Examples include as a Liquid Crystal Display (LCD), an Organic Light Emitting Diode (OLED) display device, an Active Matrix OLED (AMOLED) display device, an LED, a speaker, and a monitor.

In accordance with one or more of the aforementioned embodiments, a memory device and a method for operating the memory device are provided which may have improved performance in terms of reliability, efficiency, and/or other operational attributes.

As used herein, the terms "connected" and "coupled" may include a direct connection between two elements or an indirect connection between two elements. An indirect connection may include a case where one or more elements are connected between the two elements.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, processors, interfaces, correction circuits, decoders, generators, logic, and other signal generating and signal processing features of the embodiments disclosed herein may be implemented, for example, in non-transitory logic that may include hardware, software, or both. When implemented at least partially in hardware, the controllers, processors, interfaces, correction circuits, decoders, generators, logic, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

What is claimed is:

1. A memory device comprising:
   a plurality of memory cells programmed to one of a plurality of program states divided based on a threshold voltage; and
   a plurality of page buffers coupled to the plurality of memory cells through a plurality of bit lines,
   wherein each of the plurality of page buffers includes a latch configured to store data sensed from a corresponding bit line among the plurality of bit lines, and discharges the corresponding bit line while performing a latch setting operation including setting data stored in the latch in a verify operation on the plurality of program states.

2. The memory device of claim 1, wherein each of the plurality of page buffers includes:
   a first transistor connected between a common sensing node and a first node connected to the corresponding bit line;
   a second transistor connected between the common sensing node and a second node connected to a power voltage; and
   a third transistor connected between the first node and a reference power source.

3. The memory device of claim 2, wherein, when discharging the corresponding bit line, each of the plurality of page buffers is configured to turn off the first transistor, and apply the reference power source to the first node through the third transistor.

4. The memory device of claim 2, wherein, when discharging the corresponding bit line, each of the plurality of page buffers is configured to turn off the second transistor, and apply the reference power source to the first node through the third transistor.

5. The memory device of claim 2, wherein each of the plurality of page buffers further includes:
   a fourth transistor connected between a sensing node and the power voltage;
   a fifth transistor connected between the sensing node and the second node;
   a sixth transistor connected between the sensing node and the common sensing node; and
   a seventh transistor connected between the common sensing node and a node of the latch.

6. The memory device of claim 5, wherein, when performing the latch setting operation, each of the plurality of page buffers is configured to turn off the fifth transistor, the sixth transistor, and the seventh transistor, apply the power voltage to the sensing node through the fourth transistor, and transfer the power voltage to a node of the latch through the sensing node.

7. The memory device of claim 1, wherein the latch setting operation is an operation of storing a first logic value in respective latches of page buffers connected to bit lines on which a verify operation on a second program state among the plurality of program states is to be performed during the verify operation on the second program state, which is performed after a verify operation on a first program state among the plurality of program states is completed.

8. The memory device of claim 2, wherein each of the plurality of page buffers is configured to precharge the corresponding bit line, after the latch setting operation is completed.

9. The memory device of claim 8, wherein, when precharging the plurality of bit lines, each of the plurality of page buffers is configured to turn off the third transistor, and apply the power voltage to the first node through the first transistor and the second transistor.

10. The memory device of claim 2, wherein each of the plurality of page buffers further includes an eighth transistor connected between the power voltage and the common sensing node, and
   wherein, when a read operation is performed on the plurality of memory cells, each of the plurality of page buffers is configured to precharge the plurality of bit lines by turning off the second transistor and the third transistor and applying the power voltage to the first node through the first transistor and the eighth transistor.

11. A page buffer coupled to a plurality of memory cells through a bit line, the page buffer comprising:
   a latch configured to store data sensed from the bit line;
   a latch setting circuit configured to perform a latch setting operation which includes setting data stored in the latch in a verify operation on the plurality of memory cells; and
   a bit line controller configured to discharge the bit line while the latch setting operation is being performed.

12. The page buffer of claim 11, wherein the bit line controller includes:
   a first transistor connected between a common sensing node and a first node connected to the bit line;
   a second transistor connected between the common sensing node and a second node connected to a power voltage; and
   a third transistor connected between the first node and a reference power source.

13. The page buffer of claim 12, wherein the bit line controller is configured to discharge the bit line by turning off the first transistor, and applying the reference power source to the first node through the third transistor.

14. The page buffer of claim 12, wherein the bit line controller is configured to discharge the bit line by turning off the second transistor, and applying the reference power source to the first node through the third transistor.

15. The page buffer of claim 12, wherein the latch setting circuit includes:
   a fourth transistor connected between a sensing node and the power voltage;
   a fifth transistor connected between the sensing node and the second node;
   a sixth transistor connected between the sensing node and the common sensing node; and
   a seventh transistor connected between the common sensing node and a node of the latch.

16. The page buffer of claim 15, wherein the latch setting circuit is configured to perform the latch setting operation by turning off the fifth transistor, the sixth transistor, and the seventh transistor, applying the power voltage to the sensing node through the fourth transistor, and transferring the power voltage to a node of the latch through the sensing node.

17. The page buffer of claim 11, wherein the bit line controller is configured to precharge the bit line, after the latch setting operation is completed.

18. A method for operating a memory device including a plurality of memory cells programmed to one of a plurality of program states divided based on a threshold voltage, the method comprising:
   performing a latch setting operation which includes setting data stored in a latch;
   discharging a bit line connected to the plurality of memory cells while performing the latch setting operation; and
   precharging the bit line according to whether the latch setting operation has been completed.

19. The method of claim 18, wherein the discharging of the bit line includes:
   turning off a first transistor that is connected between a common sensing node and a first node connected to the bit line; and
   applying a reference power source to the first node through a second transistor that is connected between the reference power source and the first node.

20. The method of claim 18, wherein the discharging of the bit line includes:
   turning off a third transistor that is connected between a common sensing node and a second node connected to a power voltage; and
   applying a reference power source to a first node connected to the bit line through a fourth transistor that is connected between the first node and a reference power source.

* * * * *